(12) United States Patent
Zhang et al.

(10) Patent No.: US 11,004,893 B2
(45) Date of Patent: May 11, 2021

(54) PHOTONIC INTEGRATED DEVICE AND MANUFACTURING METHOD THEREOF

(71) Applicant: QINGDAO YICHENLEISHUO TECHNOLOGY CO., LTD, Qingdao (CN)

(72) Inventors: Ziyang Zhang, Suzhou (CN); Hongmei Chen, Suzhou (CN); Yuanqing Huang, Suzhou (CN); Qinglu Liu, Suzhou (CN)

(73) Assignee: QINGDAO YICHENLEISHUO TECHNOLOGY CO., LTD, Qingdao (CN)

( * ) Notice: Subject to any disclaimer, the term of this patent is extended or adjusted under 35 U.S.C. 154(b) by 42 days.

(21) Appl. No.: 16/473,010

(22) PCT Filed: Dec. 29, 2016

(86) PCT No.: PCT/CN2016/112845
§ 371 (c)(1),
(2) Date: Jun. 24, 2019

(87) PCT Pub. No.: WO2018/119814
PCT Pub. Date: Jul. 5, 2018

(65) Prior Publication Data
US 2020/0098820 A1    Mar. 26, 2020

(30) Foreign Application Priority Data
Dec. 27, 2016   (CN) .......................... 201611227642.0

(51) Int. Cl.
*H01L 27/15*     (2006.01)
*H01L 33/00*     (2010.01)
(Continued)

(52) U.S. Cl.
CPC ........ *H01L 27/156* (2013.01); *H01L 33/0045* (2013.01); *H01L 33/0062* (2013.01);
(Continued)

(58) Field of Classification Search
None
See application file for complete search history.

(56) References Cited

U.S. PATENT DOCUMENTS

2005/0277215 A1* 12/2005 Anikitchev ........... H01S 5/2231
                                                      438/22
2014/0354139 A1* 12/2014 Yoon ................... H01L 51/0005
                                                      313/498
2018/0090638 A1*  3/2018 Fan .................... G02F 1/133621

FOREIGN PATENT DOCUMENTS

CN      105185884 A    12/2015
CN      105489693 A     4/2016
(Continued)

OTHER PUBLICATIONS

Jh, Y., et al., "Vertical Heterostructure of Two-Dimensional MoS2 and WSe2 with Vertically Aligned Layers," Nano Letters, vol. 15, Issue 2, pp. 1031-1035 (Jan. 15, 2015).
(Continued)

*Primary Examiner* — Michelle Mandala
(74) *Attorney, Agent, or Firm* — Maschoff Brennan

(57) ABSTRACT

A photonic integrated device is provided, includes a substrate, a two-dimensional material unit and semiconductor light-emitting units located at both sides thereof are disposed on the substrate; the two-dimensional material unit is provided with a luminescent two-dimensional material of which a luminous band is longer than that of the semiconductor light-emitting unit, and the semiconductor light-emitting unit provides a pump light source for the two-dimensional material unit to pump the luminescent two-dimensional material to emit light. The photonic integrated device in the
(Continued)

present disclosure can obtain different luminous bands by changing the number of layers or kinds of the luminescent two-dimensional material. Meanwhile, the photonic integrated device according to the present disclosure adopts an optical pumping luminescence method without forming a p-n junction, which simplifies process difficulty compared with an electrical pumping luminescence method of manufacturing the p-n junction based on the luminescent two-dimensional material in the prior art.

20 Claims, 16 Drawing Sheets

(51) Int. Cl.
| | |
|---|---|
| H01L 33/06 | (2010.01) |
| H01L 33/12 | (2010.01) |
| H01L 33/30 | (2010.01) |
| H01L 33/38 | (2010.01) |
| H01L 33/44 | (2010.01) |
| H01L 33/50 | (2010.01) |
| H01L 33/58 | (2010.01) |
| H01S 5/00 | (2006.01) |
| H01S 5/02 | (2006.01) |
| H01S 5/026 | (2006.01) |
| H01S 5/028 | (2006.01) |
| H01S 5/042 | (2006.01) |
| H01S 5/34 | (2006.01) |
| H01S 5/343 | (2006.01) |
| H01S 5/40 | (2006.01) |

(52) U.S. Cl.
CPC .............. *H01L 33/06* (2013.01); *H01L 33/12* (2013.01); *H01L 33/30* (2013.01); *H01L 33/38* (2013.01); *H01L 33/44* (2013.01); *H01L 33/502* (2013.01); *H01L 33/505* (2013.01); *H01L 33/58* (2013.01); *H01S 5/005* (2013.01); *H01S 5/0206* (2013.01); *H01S 5/026* (2013.01); *H01S 5/028* (2013.01); *H01S 5/0421* (2013.01); *H01S 5/343* (2013.01); *H01S 5/3412* (2013.01); *H01S 5/4025* (2013.01); *H01L 2933/0016* (2013.01); *H01L 2933/0025* (2013.01); *H01L 2933/0041* (2013.01); *H01L 2933/0058* (2013.01)

(56) References Cited

FOREIGN PATENT DOCUMENTS

| CN | 105633191 A | | 6/2016 |
|---|---|---|---|
| JP | 2007329354 A | * | 12/2007 |

OTHER PUBLICATIONS

Koppens, H.L., F., et al. "Photodetectors Based on Graphene, Other Two dimensional Materials and Hybrid Systems," Nature Nanotechnology, vol. 9, Issue 10, pp. 780-793 (Oct. 6, 2014).

Lopez-Sanchez, O., et al., "Light Generation and Harvesting in a Van der Waals Heterostructure," ACS Nano, vol. 8, Issue 3, pp. 3042-3048 (Mar. 6, 2014).

* cited by examiner

PHOTONIC INTEGRATED DEVICE AND MANUFACTURING METHOD THEREOF

TECHNICAL FIELD

The present disclosure belongs to a semiconductor photoelectric integration technology field, in particular, relates to a photonic integrated device and a manufacturing method thereof.

BACKGROUND ART

Excellent physical and chemical properties presented by a two-dimensional material with atomic-level thickness, such as graphene, boron nitride, two-dimensional transition metal sulfides, black phosphorus and so on, get an extensive concern from people. Graphene has many excellent properties such as high-electronic mobility, high thermal conductivity, room-temperature Hall effect and so on. However, graphene has a smaller switching current ratio due to the zero band gap thereof, which limits its application in practical devices. However, although a carrier mobility of a monolayer structure of the two-dimensional transition metal sulfides, for example, $MoS_2$, is lower than that of graphene, it has a direct band gap of about 1.8 eV and a relatively high switching current ratio, this inspired people to start exploring new two-dimensional materials for specific purposes.

At present, there are studies showing that a black phosphorus-based transistor has a higher switching current ratio and excellent carrier mobility. Meanwhile, a change of the number of layers also has an important impact on electronic structures of the black phosphorus and transition metal sulfides. From a monolayer to a thin layer bulk material, a band gap value of the black phosphorus may vary from 2.0 eV to 0.3 eV, and the band gap value of $MoS_2$ in the transition metal sulfides may vary from 1.8 eV to 1.29 eV. Thus, seeking for a two-dimensional semiconductor material system, which has both advantages of graphene and two-dimensional transition metal sulfides on photoelectric properties and also has an appropriate electronic band structure and excellent carrier mobility, has aroused widespread concern in the scientific research and industrial circles. According to the unique photoelectric characteristics and advantages of the two-dimensional material, researchers try to manufacture a p-n junction quantum light emitting system using the two-dimensional material (for example, black phosphorus and transition metal sulfides and the like). For example, Ross et al., University of Washington, USA and Lopez-Sanchez et al., Swiss federal Institute of Technology in Lausanne manufacture a p-n junction light emitting diode on the basis of monolayer two-dimensional materials $WSe_2$ and $MoS_2$, and obtain an electroluminescence spectrum at a band of 600 nm to 800 nm. But, in the actual process preparation, an purity of the interface between the two-dimensional materials and other materials is difficult to be guaranteed, and the contact resistance thereof is relatively large, which directly leads to corresponding light-emitting devices being manufactured harder and having an extremely low luminous efficiency. These problems are the main factors that restrict the development of two-dimensional material light-emitting devices at present.

SUMMARY

For solving the above problems existing in the prior art, the present disclosure provides a photonic integrated device and a manufacturing method thereof. The photonic integrated device pumps a luminescent two-dimensional material between semiconductor light-emitting units located at both sides of the luminescent two-dimensional material by using the semiconductor light-emitting units. It can not only avoid problems of the difficulty of manufacturing luminescent two-dimensional material in existing p-n junction devices and the low luminous efficiency, but also can obtain photonic integrated devices with different bands.

In order to achieve the above purpose of invention, the present disclosure adopts the following technical solutions:

a photonic integrated device, which includes a substrate; a two-dimensional material unit and semiconductor light-emitting units located at both sides thereof are disposed on the substrate; the two-dimensional material unit is provided with a luminescent two-dimensional material of which a luminous band is longer than that of the semiconductor light-emitting units, and the semiconductor light-emitting units provides a pump light source for the two-dimensional material unit to pump the luminescent two-dimensional material to emit light.

Furthermore, a plurality of the semiconductor light-emitting units are arranged spaced apart at each of the both sides of the two-dimensional material unit.

Furthermore, light outlets of the plurality of semiconductor light-emitting units at the both sides of the two-dimensional material unit are opposite in a staggered manner.

Furthermore, the semiconductor light-emitting unit is a semiconductor laser or a superluminescent diode.

Furthermore, two to fifty the semiconductor light-emitting units are disposed at each of the both sides of the two-dimensional material unit; a distance between each two adjacent semiconductor light-emitting units is 20 μm to 500 μm; and the semiconductor light-emitting unit has a length of 0.5 mm to 5 mm and a width of 5 μm to 200 μm.

Furthermore, the luminescent two-dimensional material is selected from at least one of black phosphorus, transition metal compound, graphene, and boron nitride.

Furthermore, the luminescent two-dimensional material has a thickness of 1 ML to 2 μm.

Furthermore, the two-dimensional material unit includes the luminescent two-dimensional material and a dielectric film entirely coating the luminescent two-dimensional material; and the semiconductor light-emitting unit includes sequentially laminated a buffer layer, a lower coating layer, a lower waveguide layer, an active layer, an upper waveguide layer, an upper coating layer and an ohmic contact layer.

Furthermore, the buffer layer, the lower coating layer and a portion of the lower waveguide layer adjacent to the lower coating layer in a plurality of the semiconductor light-emitting units extend and connect into a whole.

Furthermore, the active layer and a portion of the upper waveguide layer adjacent to the active layer in the a plurality of the semiconductor light-emitting units extend and connect into a whole.

Furthermore, the dielectric film extends towards a top surface of the semiconductor light-emitting unit to form an extension part on which a positive electrode is disposed, and the positive electrode penetrates the extension part and is in contact with the ohmic contact layer; and a negative electrode is disposed on the substrate.

Another object of the present disclosure is to provide a manufacturing method of any one of the above photonic integrated devices, which includes:

selecting a substrate and manufacturing an etching base layer on the substrate, the etching base layer comprising a buffer material layer, a lower coating material layer, a lower waveguide material layer, an active region material layer, an upper waveguide material layer, an upper coating material layer and an ohmic contact material layer sequentially laminated on the substrate;

etching the etching base layer in a direction perpendicular to the substrate, and forming a two-dimensional material filling slot and semiconductor light-emitting units located at both sides of the two-dimensional material filling slot on the substrate, wherein a plurality of the semiconductor light-emitting units are formed at both sides of the two-dimensional material filling slot, respectively;

forming a two-dimensional material unit which comprising a luminescent two-dimensional material and a dielectric film entirely coating the luminescent two-dimensional material in the two-dimensional material filling slot; and manufacturing a positive electrode on the ohmic contact layer and a negative electrode on the substrate.

Furthermore, a distance between a bottom surface of the two-dimensional material filling slot and the substrate is 20 nm to 500 nm less than the distance between a bottom of the active region material layer and the substrate; and the two-dimensional material filling slot has a length of 0.1 mm to 10 mm and a width of 10 μm to 500 μm.

The present disclosure has the following advantageous effects:

(1) the present disclosure provides a photonic integrated device with a novel structure, the photonic integrated device avoids a problem that a quality of a interface between a luminescent two-dimensional material and other materials can hardly be guaranteed when the luminescent two-dimensional material is adopted in the prior art, and reduces requirements on the manufacturing process; this is because the photonic integrated device of the present disclosure adopts an optical pumping luminescence method without forming a p-n junction, which simplifies process difficulty compared with an electrical pumping luminescence method of manufacturing the p-n junction based on the luminescent two-dimensional material in the prior art;

(2) the photonic integrated device of the present disclosure improves the luminous efficiency of the luminescent two-dimensional material, it is easier to obtain a higher power photonic integrated device; compared with the direct-electrical pumping luminescence method in the prior art, the optical pumping luminescence method will no longer be affected by contact resistances of different materials, that is, it reduces a carrier loss and improves the luminous efficiency and light output power;

(3) the photonic integrated device provided in the present disclosure can obtain the photonic integrated devices having different luminous bands only by changing the number of layers or kinds of the luminescent two-dimensional material on the premise of not changing the structure of the semiconductor light-emitting unit; and (4) the manufacturing method of the photonic integrated device according to the present disclosure is standardized and is compatible with the manufacturing process of the existing semiconductor device, which reduces the production cost and is conductive to mass production.

BRIEF DESCRIPTION OF THE DRAWINGS

These and other aspects, features and advantages of embodiments of the present disclosure will become apparent from the following description, taken in conjunction with the accompanying drawings in which.

DETAILED DESCRIPTION OF THE PREFERRED EMBODIMENTS

Figure 1:
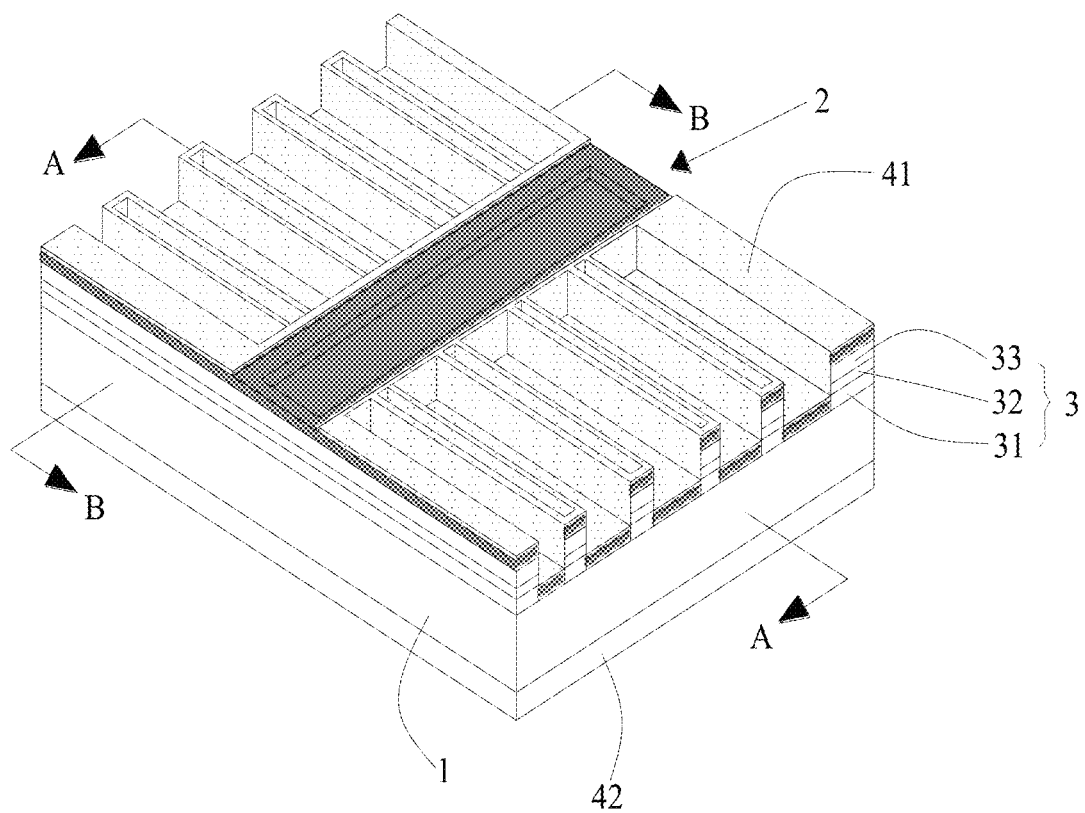
FIG. 1 is a structural diagram of a photonic integrated device according to embodiment 1 of the present disclosure.

Embodiments of the present disclosure will be described in detail below by referring to the accompany drawings. However, the present disclosure can be implemented in numerous different forms, and the present disclosure may not be explained to be limited to specific embodiments set forth herein. Instead, these embodiments are provided for explaining the principle and actual application of the present disclosure, thus those skilled in the art can understand various embodiments and amendments which are suitable for specific intended applications of the present disclosure. In the drawings, the shapes and dimensions of elements may be exaggerated for clarity, and the same signs will be used throughout to designate the same or like elements.

It will be understood that although terms of "first", "second" and so on here can be used to describe various elements or matters, these elements or matters shall not be limited by these terms. These terms are only used for distinguishing an element or matter from another element or matter.

Embodiment 1

Figure 2:
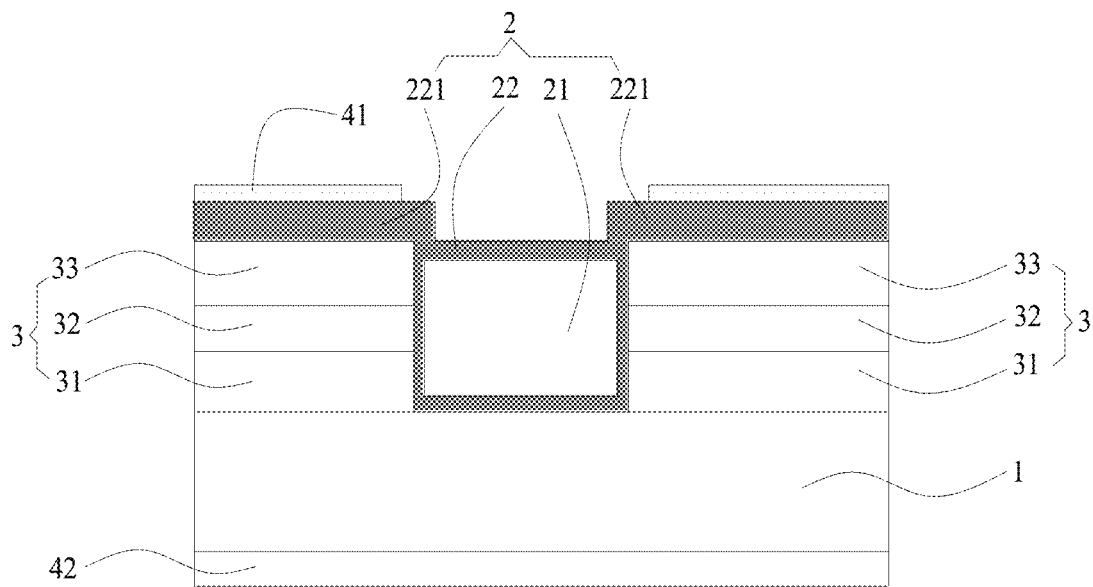
FIG. 2 is a cross-section diagram of the photonic integrated device of FIG. 1 in an A-A direction.

FIG. 1 is a structural diagram of a photonic integrated device according to embodiment 1 of the present disclosure; FIG. 2 is a cross-section diagram of the photonic integrated device of FIG. 1 in an A-A direction; and FIG. 3 is a cross-section diagram of the photonic integrated device of FIG. 1 in a B-B direction.

Figure 3:
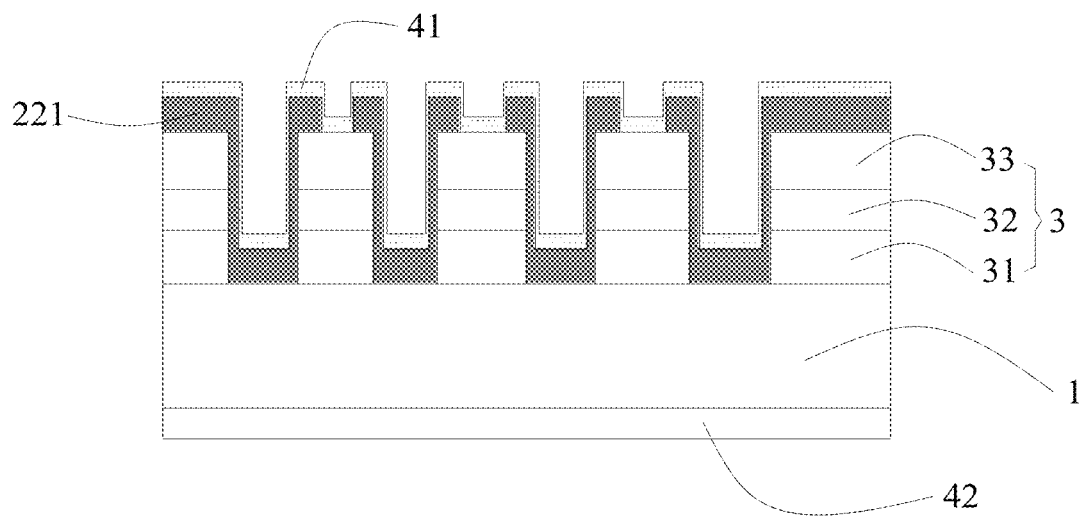
FIG. 3 is a cross-section diagram of the photonic integrated device of FIG. 1 in a B-B direction.

Referring to FIGS. 1-3, the present embodiment provides a photonic integrated device which includes a substrate 1, a two-dimensional material unit 2 disposed on the substrate 1 and semiconductor light-emitting units 3 located at both sides of the two-dimensional material unit 2; and a positive electrode 41 is provided on the top layer of the semiconductor light-emitting unit 3, and a negative electrode 42 is provided on the substrate 1.

The two-dimensional material unit 2 is provided therein with a luminescent two-dimensional material 21 of which a luminous band is longer than that of the semiconductor light-emitting unit 3, and the semiconductor light-emitting unit 3 provides a pump light source to for the luminescent two-dimensional material 21 to pump the luminescent two-dimensional material 21 to emit light after receiving an external current.

In particular, a material of the substrate 1 may be GaAs, InP, GaN or sapphire and so on, the luminescent two-dimensional material 21 may be at least one of high-temperature-intolerance black phosphorus or high-temperature-resistant (generally above 300° C.) transition metal compound, graphene or boron nitride and so on. In the present embodiment, the substrate 1 specifically is GaAs. A thickness of the luminescent two-dimensional material 21 is generally controlled to be 1 ML to 2 μm, wherein 1 ML represents a thickness of one atomic layer. That is to say, the luminescent two-dimensional material 21 may be one atomic layer, or may also be stacked multilayer atomic layers with a total thickness of no more than 2 μm. Thus, the photonic integrated device may have different bands of luminescent by changing the material or the number of layers of the luminescent two-dimensional material 21.

A plurality of alternatively arranged semiconductor light-emitting units 3 may be provided at both sides of the two-dimensional material unit 21, and the number of the semiconductor light-emitting units 3 at each side is preferably two to fifty; a distance between each adjacent two semiconductor light-emitting units 3 is controlled to be 20 μm to 500 μm; and a length of each of the semiconductor light-emitting units 3 is controlled to be 0.5 mm to 5 mm and a width thereof is controlled to be 5 μm to 200 μm.

To achieve a higher pumping effect, light outlets of the plurality of semiconductor light-emitting units 3 at the both sides of the two-dimensional material unit 2 are preferably opposite in a staggered manner. That is to say, the light outlets of the plurality of semiconductor light-emitting units 3 at both sides of the two-dimensional material unit 2 face the two-dimensional material unit 2, and projections of the light outlets of all the semiconductor light-emitting units 3 at the same side on a plane where the light outlets of the semiconductor light-emitting units 3 at the other side are are interlaced with the light outlets of the semiconductor light-emitting units 3 at the other side, and preferably are staggered completely, so that more pump light can propagate onto the luminescent two-dimensional material 21 in the two-dimensional material unit 2 and pump it to emit light.

More specifically, the two-dimensional material unit 2 may also include a first dielectric film 22 coated the luminescent two-dimensional material 21; and a material of the first dielectric film 22 may be $SiO_2$ or $Si_3N_4$, and a thickness of the first dielectric film 22 coated the luminescent two-dimensional material 21 is uneven.

The semiconductor light-emitting unit 3 includes a lower structural layer 31, an active layer 32 and an upper structural layer 33 sequentially laminated on the substrate 1; specifically, the lower structural layer 31 includes a buffer layer, a lower coating layer and a lower waveguide layer sequentially disposed on the substrate 1, and the upper structural layer 33 includes an upper waveguide layer, an upper coating layer and an ohmic contact layer sequentially disposed on the active layer 32.

In the present embodiment, a material of the buffer layer is GaAs, materials of the lower coating layer and the lower waveguide layer both are n-type doped AlGaAs; a material of the active layer 32 is InAs/GaAs quantum dot; and materials of the upper waveguide layer and the upper coating layer both are p-type doped AlGaAs, and a material of the ohmic contact layer is p-type heavily doped GaAs. Alternatively, the material of the active layer 32 may also be selected from InAs/InP quantum dot, InGaN/GaN quantum dot, InGaAsP/InP quantum well, InAs/GaAs quantum well, InGaAs/InAlAs quantum well, InGaN/GaN quantum well and so on. Meanwhile, the materials of the buffer layer, the lower coating layer, the lower waveguide layer, the upper waveguide layer, and the upper coating layer may be specifically selected according to the materials of the substrate 1 and the active layer 32, which is omitted here, and those skilled in the art can refer to the prior art.

The first dielectric film 22 extends towards the semiconductor light-emitting units 3 at both sides thereof to form an extension part 221 which covers top surfaces of the semiconductor light-emitting units 3 and a surface of the substrate 1 between the semiconductor light-emitting units 3. In other words, there is no interconnection between internal structural layers of the plurality of semiconductor light-emitting units 3, and the semiconductor light-emitting unit 3 is a semiconductor laser.

It is noted that according to the manufacturing process of different photonic integrated devices, on the one hand, an entirety of the lower structural layer 31 or a part close to the substrate 1 thereof may extend towards the two-dimensional material unit 2 and be interposed between the two-dimensional material unit 2 and the substrate 1. On the other hand, since different luminescent two-dimensional materials 21 cause the manufacturing processes to be different, a thickness of the extension part 221 may be caused to be different from that of the first dielectric film 22, and the thickness of the extension part is generally 10 nm to 1200 nm.

A positive electrode 41 is provided on the extension part 221 on top surface of each semiconductor light-emitting unit 3, and the positive electrode 41 penetrates the extension part 221 on the top surface of the semiconductor light-emitting unit 3 and is in contact with the ohmic contact layer; and a negative electrode 42 is provided on a bottom surface of the substrate 1 facing away from the two-dimensional material unit 2 and the semiconductor light-emitting unit 3.

Preferably, a plurality of positive electrodes 41 at the same side of the two-dimensional material unit 2 extend towards both sides thereof and connect into a whole.

For example, compared with a p-n junction electrical pumping light-emitting device manufactured using the luminescent two-dimensional material in the prior art, first, the photonic integrated device of this embodiment disposed with a special structure avoids the problem that a quality of a contact interface of the luminescent two-dimensional material and other materials can hardly be guaranteed in the prior art, reduces requirements on the manufacturing process and simplifies process difficulty; second, the photonic integrated device provided in this embodiment improves the luminous efficiency of the luminescent two-dimensional material 21, thus it is easier to obtain a higher power photonic integrated device, and compared with the direct-electrical pumping luminescence method, the optical pumping luminescence method will no longer be affected by contact resistances of different materials, that is, it reduces a carrier loss and improves the luminous efficiency and light output power; and third, the photonic integrated device provided in this embodiment can obtain the photonic integrated devices having different bands of luminescence only by changing material and the number of layers of the luminescent two-dimensional material 21 without changing the structure of the semiconductor light-emitting unit 3.

Embodiment 2

Figure 4:
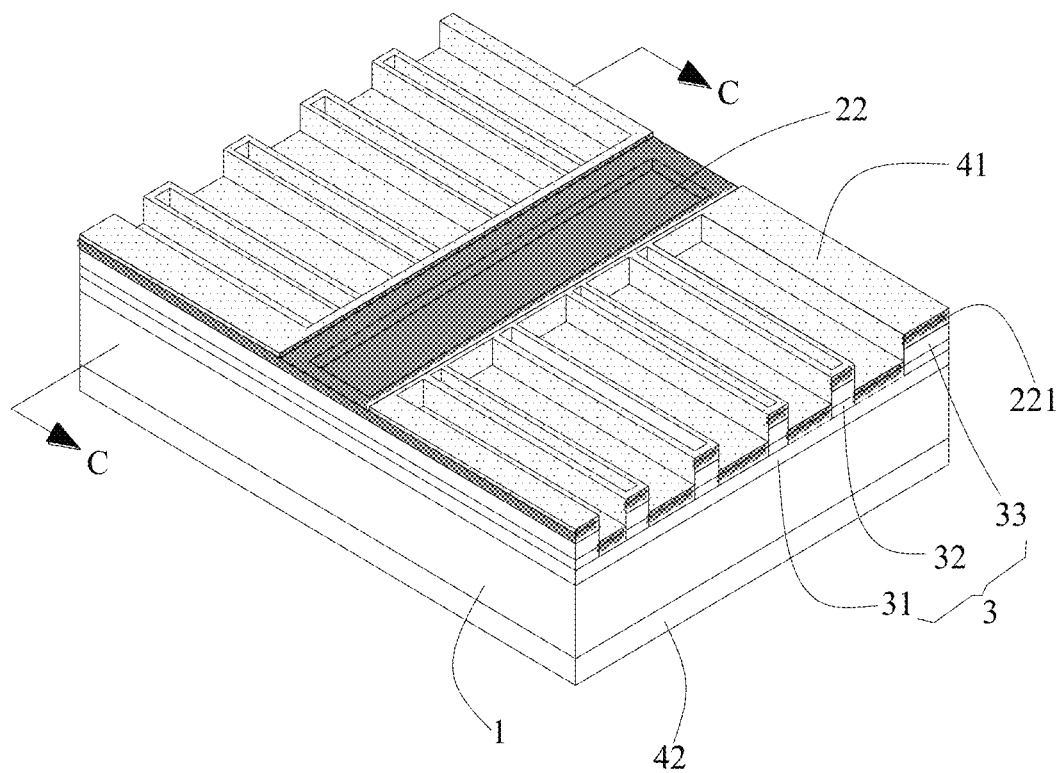
FIG. 4 is a structural diagram of a photonic integrated device according to embodiment 2 of the present disclosure.
Figure 5:
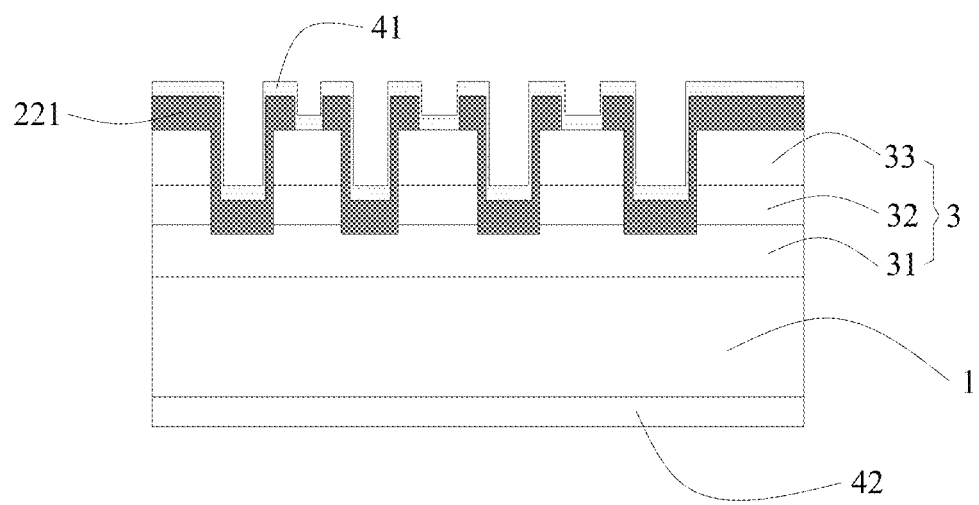
FIG. 5 is a cross-section diagram of the photonic integrated device of FIG. 4 in a C-C direction.

In the description of embodiment 2, similarities with embodiment 1 will be omitted here, and only differences from embodiment 1 will be described. Referring to FIGS. 4 and 5, the difference between embodiment 2 and embodiment 1 is that partial lower structural layers 31 in the plurality of semiconductor light-emitting units 3 extend and connect into a whole, meanwhile, the extension part 221 covers the partial lower structural layers 31 among the plurality of semiconductor light-emitting units 3.

In this embodiment, the partial lower structural layers 31 extending and connecting into a whole specifically refers to the buffer layer, the lower coating layer, and partial lower waveguide layer adjacent to the lower coating layer.

Embodiment 3

Figure 6:
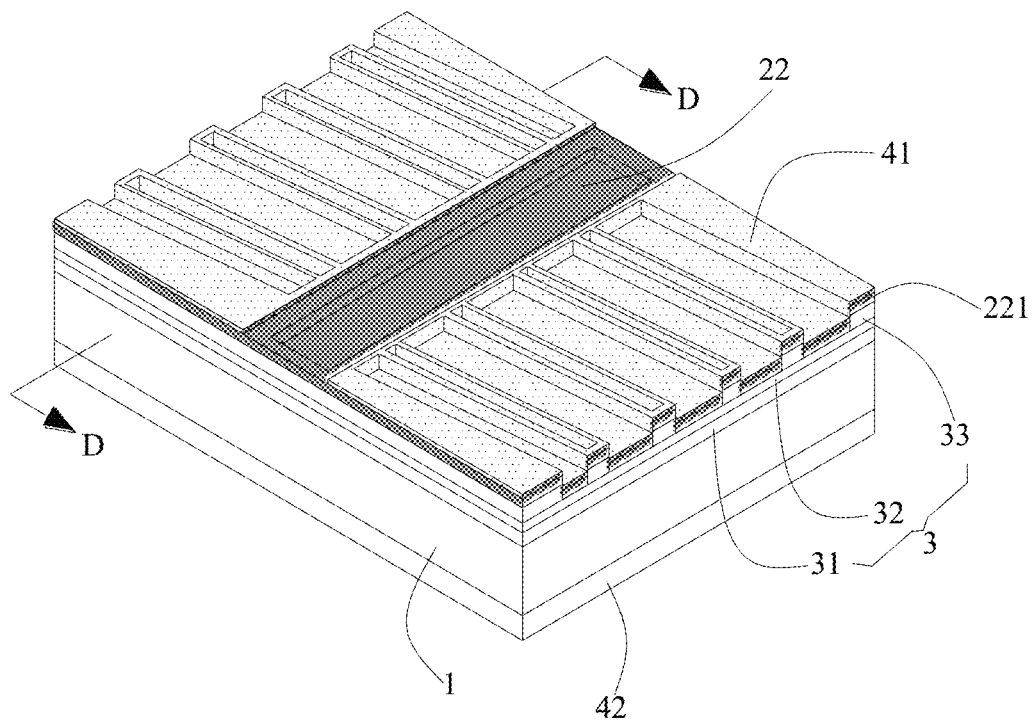
FIG. 6 is a structural diagram of a photonic integrated device according to embodiment 3 of the present disclosure.
Figure 7:
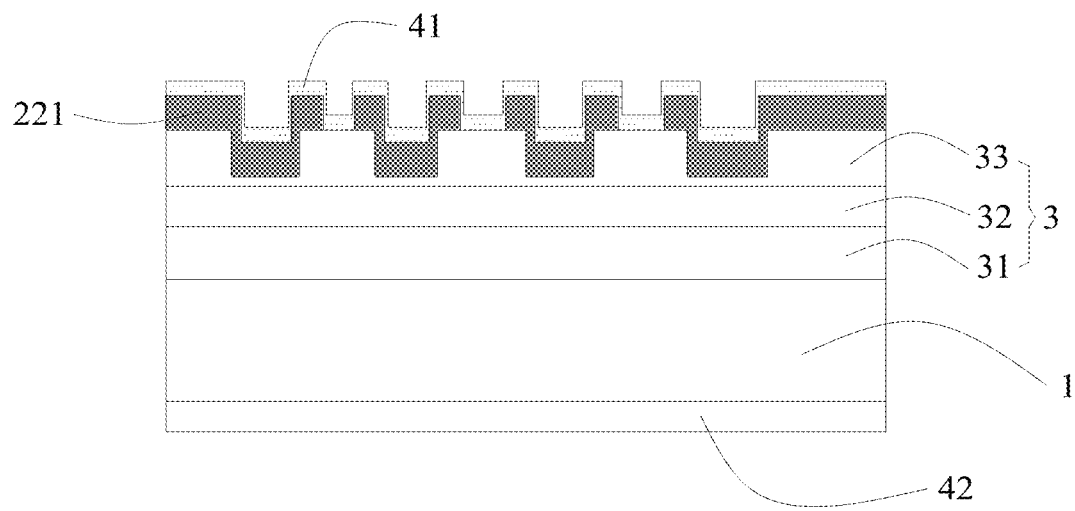
FIG. 7 is a cross-section diagram of the photonic integrated device of FIG. 6 in a D-D direction.

In the description of embodiment 3, similarities with embodiment 1 will be omitted here, and only differences from embodiment 1 will be described. Referring to FIGS. 6 and 7, the difference between embodiment 3 and embodiment 1 is that the lower structural layers 33, the active layers 32 and partial upper structural layers 33 in the plurality of semiconductor light-emitting units 3 collectively extend and connect into a whole, and the extension part 221 covers the partial lower structural layers 33 among the plurality of semiconductor light-emitting units 3. Meanwhile, an angle between the semiconductor light emitting unit 3 and the two-dimensional material unit 2 is not equal to 90 degrees. So, the semiconductor light-emitting unit 3 specifically is a superluminescent diode.

In this embodiment, the partial upper structural layers 33 extending and connecting into a whole specifically refers to partial upper waveguide layer adjacent to the active layer 32.

The structure of the semiconductor light-emitting unit 3 in the photonic integrated device provided in this embodiment has less light loss.

Embodiment 4

Figure 8:
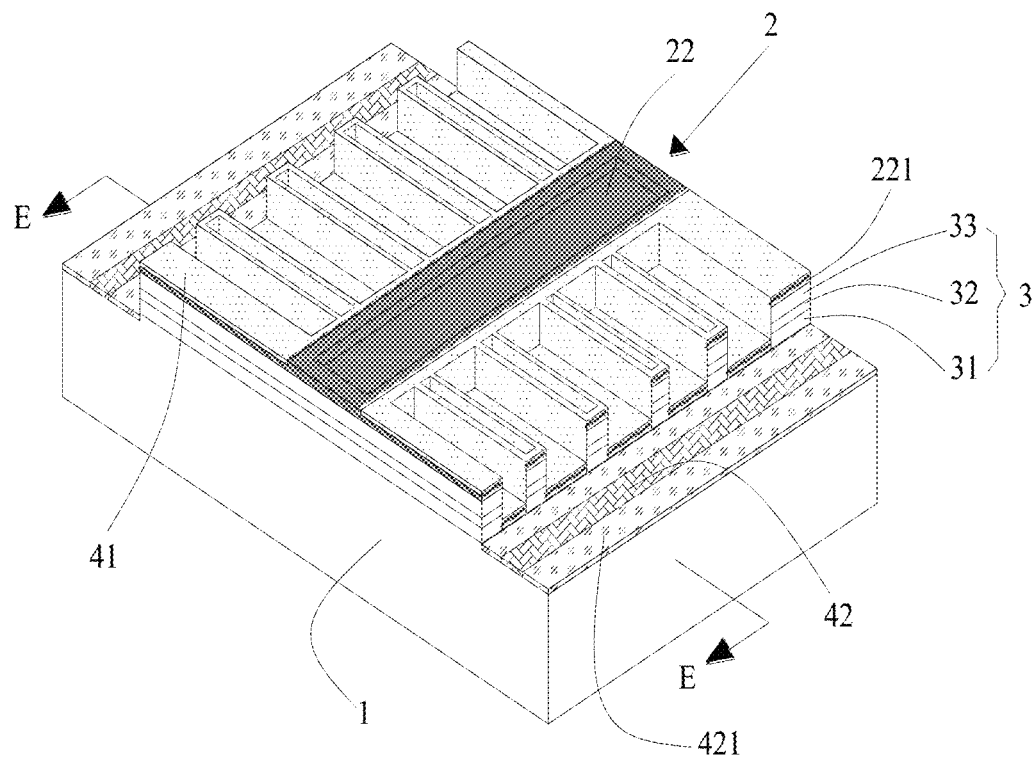
FIG. 8 is a structural diagram of a photonic integrated device according to embodiment 4 of the present disclosure.
Figure 9:
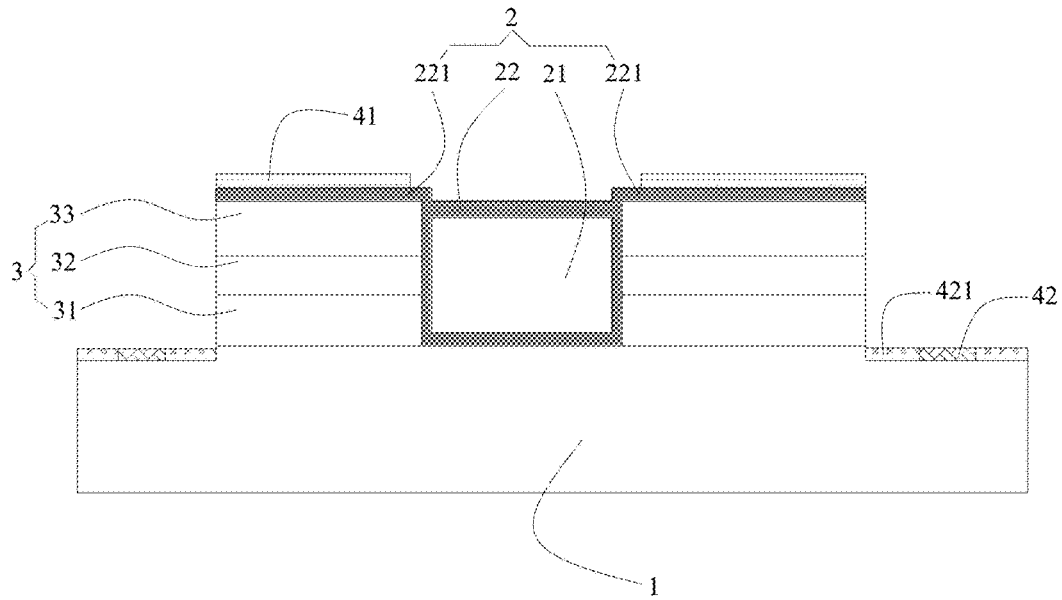
FIG. 9 is a cross-section diagram of the photonic integrated device of FIG. 8 in an E-E direction.

In the description of embodiment 4, similarities with embodiment 1 will be omitted here, and only differences from embodiment 1 will be described. Referring to FIGS. 8 and 9, a top surface of the substrate 1 outside an end of the semiconductor light-emitting unit 3 away from the two-dimensional material unit 2 is exposed, a second dielectric film 421 is disposed on the exposed area, a negative electrode 42 is disposed on the second dielectric film 421, and the negative electrode 42 penetrates the second dielectric film 421 to come into contact with the substrate 1 in the exposed area. That is to say, the negative electrode 42 is disposed on a surface of the substrate 1 on which the two-dimensional material unit 2 and the semiconductor light-emitting unit 3 are disposed.

In general, the second dielectric film 421 has a thickness of 10 nm to 600 nm, and a material of the second dielectric film 421 is $SiO_2$ or $Si_3N_4$.

Certainly, the photonic integrated device having a structure of the negative electrode 42 in this embodiment is not limited to the structure of the semiconductor light-emitting unit 3 described in this embodiment, and the plurality of semiconductor light-emitting units 3 at the same side of the two-dimensional material unit 2 may also (simultaneously) extend and connect into a whole as the partial lower structural layers 31 in a plurality of semiconductor light-emitting unit 3 in embodiment 2, or the lower structural layer 31, the active layer 32 and the partial upper structural layers 33 in the plurality of semiconductor light-emitting unit 3 in embodiment 3.

It is noted that the structure of the semiconductor light-emitting unit 3 in the photonic integrated device according to the embodiments of the present disclosure is not limited to that described in the above embodiments 1-4, those skilled in the art may design specific structures such as material, thickness and depth of the semiconductor light-emitting unit 3 by referring to a structure of a semiconductor laser or a superluminescent diode in the prior art, which is omitted here.

Embodiment 5

The present embodiment provides a manufacturing method of the photonic integrated device of embodiment 1. The manufacturing method provided in this embodiment is conducted mainly for the luminescent two-dimensional material as a high-temperature-resistant material in the photonic integrated device.

Figure 10:
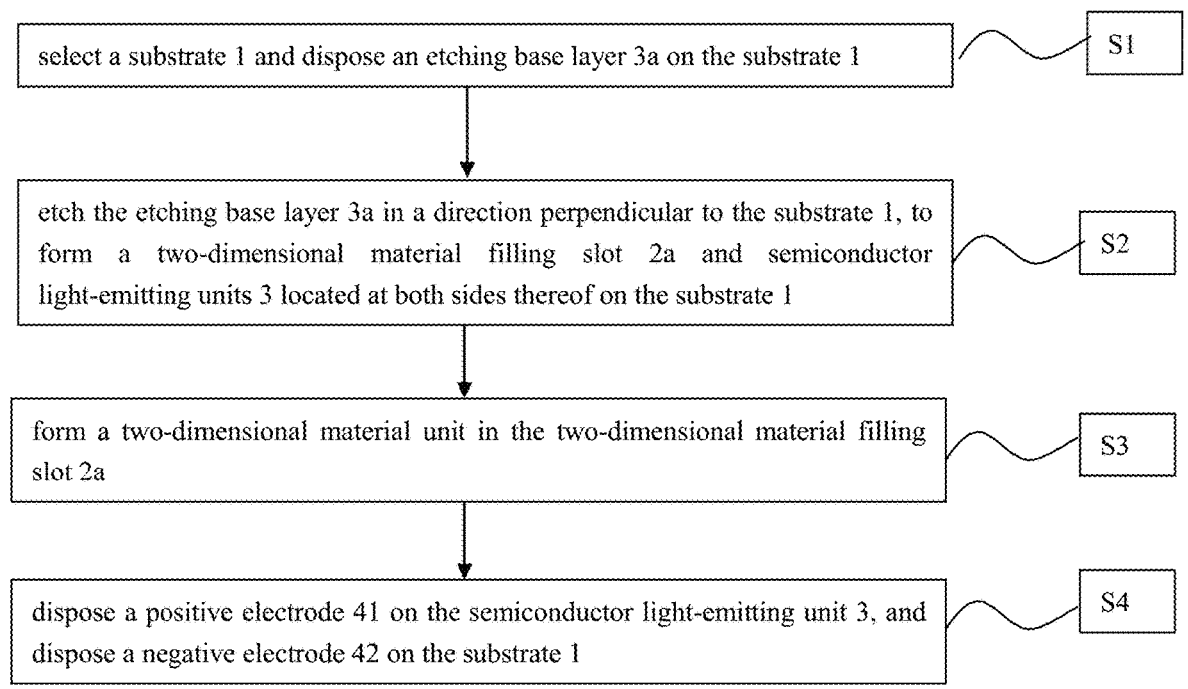
FIG. 10 is a flow diagram of a manufacturing method of a photonic integrated device according to embodiment 5 of the present disclosure.

FIG. 10 is a flow diagram of a manufacturing method of a photonic integrated device according to embodiment 5 of the present disclosure.

Referring to FIG. 10, the manufacturing method of the photonic integrated device according to the present embodiment includes:

Step S1, a substrate 1 is selected, and an etching base layer 3a is manufactured on the substrate 1.

Figure 11:
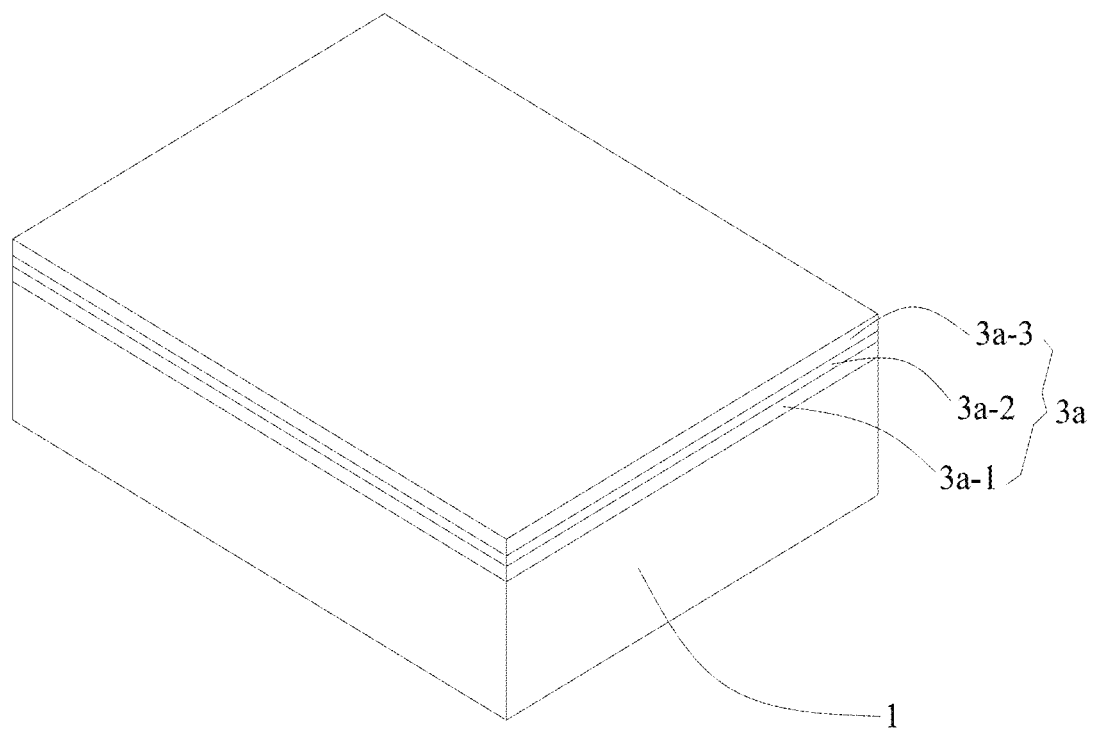
FIGS. 11-19 are process diagrams of the manufacturing method of the photonic integrated device according to embodiment 5 of the present disclosure.

Specifically, the etching base layer 3a includes a lower structure material layer 3a-1, an active region material layer 3a-2 and an upper structure material layer 3a-3 sequentially laminated on the substrate 1, as shown in FIG. 11. More specifically, in a direction away from the substrate 1, the lower structure material layer 3a-1 includes a buffer material layer, a lower coating material layer, and a lower waveguide material layer, the upper structure material layer 3a-3 includes an upper waveguide material layer, an upper coating material layer and an ohmic contact material layer.

In the present embodiment, a material of the buffer material layer is GaAs, materials of the lower coating material layer and the lower waveguide material layer both are n-type doped AlGaAs; a material of the active region material layer 3a-2 is InAs/GaAs quantum dot; and materials of the upper waveguide material layer and the upper coating material layer both are p-type doped AlGaAs, and a material of the ohmic contact material layer is p-type heavily doped GaAs. Certainly, the material of the active region material layer 3a-2 may also be selected from InAs/InP quantum dot, InGaN/GaN quantum dot, InGaAsP/InP quantum well, InAs/GaAs quantum well, InGaAs/InAlAs quantum well, InGaN/GaN quantum well and so on. Meanwhile, the materials of the buffer material layer, the lower coating material layer, the lower waveguide material layer, the upper waveguide material layer, and the upper coating material layer may be specifically selected according to the materials of the substrate 1 and the active region material layer 3a-2, which is omitted here, and those skilled in the art can refer to the prior art.

In general, the method of manufacturing the etching base layer 3a on the substrate 1 may be Molecular Beam Epitaxy (MBE for short) or Metal Organic Chemical Vapor Deposition (MOCVD) etc.

Step S2, the etching base layer 3a is etched in a direction perpendicular to the substrate 1, and a two-dimensional material filling slot 2a and semiconductor light-emitting units 3 located at both sides thereof are formed on the substrate 1.

Figure 12:
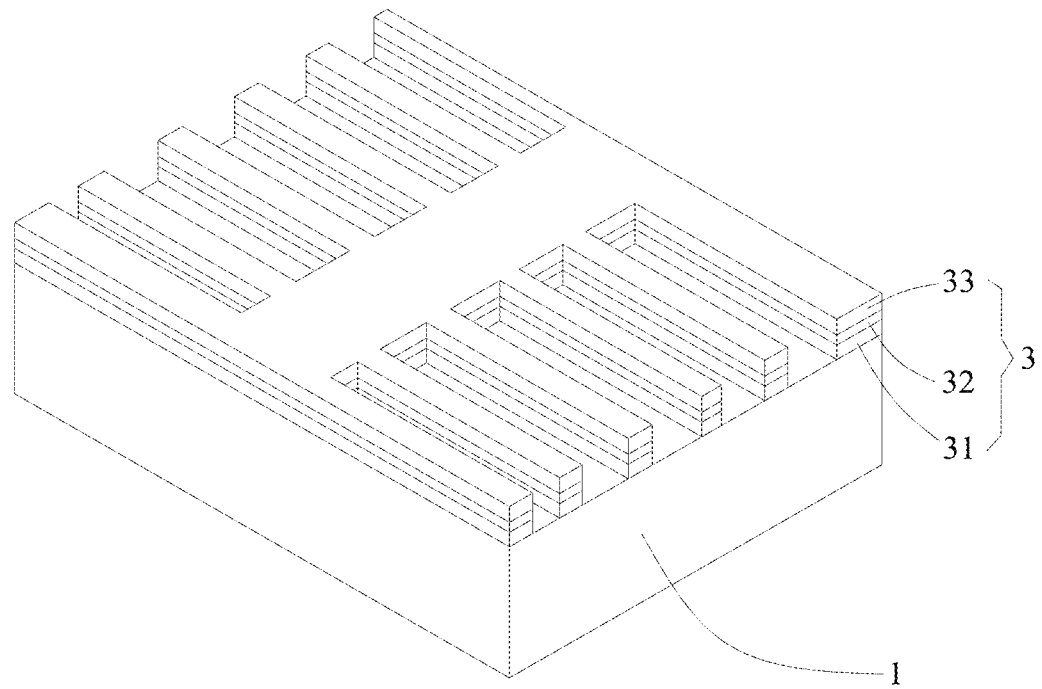
Figure 13:
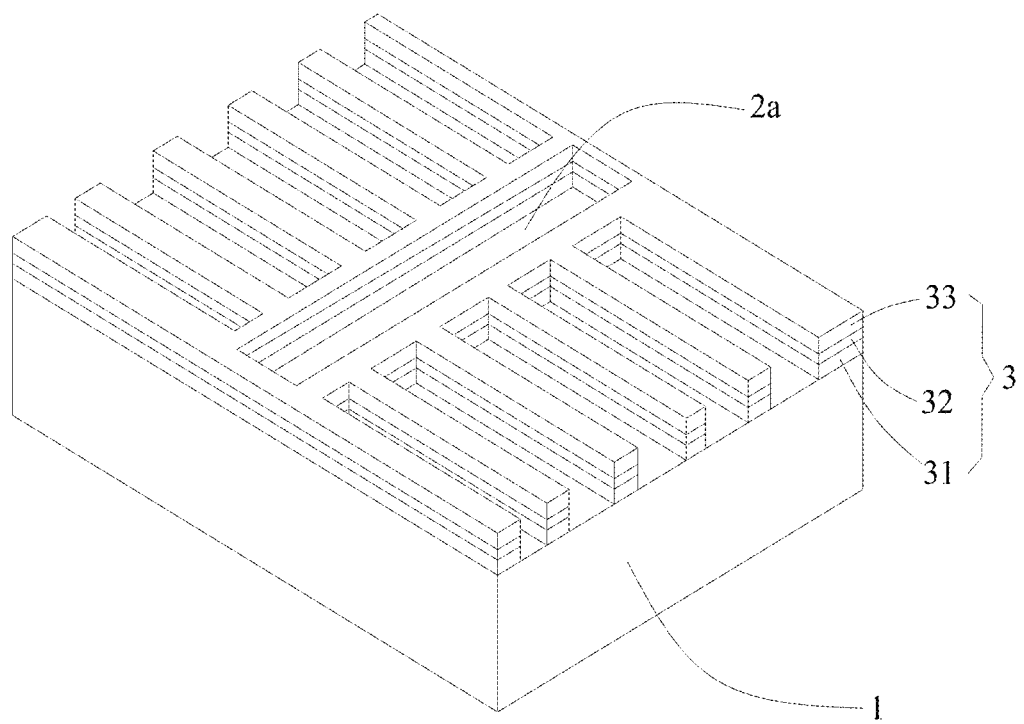

In particular, firstly, opposing semiconductor light-emitting units 3 are formed by etching the etching base layer 3a, as shown in FIG. 12; and then the two-dimensional material filling slot 2a is formed by etching the etching base layer 3a between the opposing semiconductor light-emitting units 3, as shown in FIG. 13.

More specifically, the two-dimensional material filling slot 2a has a length of 0.1 mm to 10 mm and a width of 10 μm to 500 μm. Meanwhile, a distance from a bottom surface of the two-dimensional material filling slot 2a to the substrate 1 is 20 nm to 500 nm lower than the distance from a bottom surface of the active region material layer 3a-2 to the substrate 1; that is to say, an etching depth of the two-dimensional material filling slot 2a is 20 nm to 500 nm downwards from the active region material layer 3a-2. Thus, according to different thicknesses of the buffer material layer, the lower coating material later and the lower waveguide material layer, the two-dimensional material filling slot 2a may be etched to the lower waveguide layer, the lower coating material layer, or the buffer layer, or even a part of the substrate 1 may be etched. But, the performance of the eventually obtained photonic integrated device will not be affected whichever layer the bottom surface of the two-dimensional material filling slot 2a is level with.

Preferably, a plurality of semiconductor light-emitting units 3 are formed at both sides of the two-dimensional material filling slot 2a, and each of the semiconductor light-emitting units 3 includes laminated the lower structural layer 31, the active layer 32 and the upper structural layer 33. Meanwhile, the light outlet of each of the semiconductor light-emitting units 3 faces the two-dimensional material filling slot 2a, and the light outlets of the plurality of semiconductor light-emitting units 3 distributed at one side of the two-dimensional material filling slot 2a are interlaced with the light outlets of the plurality of semiconductor light-emitting units 3 distributed at the other side; that is to say, projections of the light outlets of the semiconductor light-emitting units 3 at one side on a plane where the light outlets of the plurality of semiconductor light-emitting units 3 at the other side are do not completely overlap (preferably, do not overlap at all) the plurality of light outlets at the other side. So, pump light emitted from the light outlets of the plurality of semiconductor light-emitting units 3 distributed at both sides of the two-dimensional filling slot 2a may form a larger pumping area, so as to improve the pumping efficiency of the eventually obtained photonic integrated device, and a mutual interference among the plurality of semiconductor light-emitting units 3 may be reduced to prolong the lifetime of the semiconductor light-emitting units 3.

Preferably 2 to 50 semiconductor light-emitting units 3 are formed at each side of the two-dimensional material filling slot 2a, and a distance between each two adjacent semiconductor light-emitting units 3 at the same side is 20 μm to 500 μm. Each of the semiconductor light-emitting units 3 has a length of 0.5 mm to 5 mm and a width of 5 μm to 200 μm.

It is noted that in the present embodiment, when etching the etching base layer 3a to form a semiconductor light-emitting unit 3, the etching process can be performed enough deep to reach a surface of the substrate 1. So, the formed semiconductor light-emitting unit 3 is a semiconductor laser, and this structure has a strong optical limiting action effect on waveguides. Certainly, the above etching process can also be performed enough deep to reach the lower structure material layer 3a-1 and a portion of the lower waveguide material layers is etched, that is, the photonic integrated device shown in embodiment 2 is obtained. If the above etching process can be performed enough deep to reach the upper waveguide material layer, and meanwhile a shape of the semiconductor light-emitting unit 3 is changed accordingly, such as an inclined or curved shape by forming a non-90 degrees angle with respective to the two-dimensional material filling slot 2a, and thus the formed semiconductor light-emitting unit 3 is a superluminescent diode, that is, the photonic integrated device shown in embodiment 3 is obtained.

Step S3, a two-dimensional material unit 2 is formed in the two-dimensional material filling slot 2a.

Figure 14:
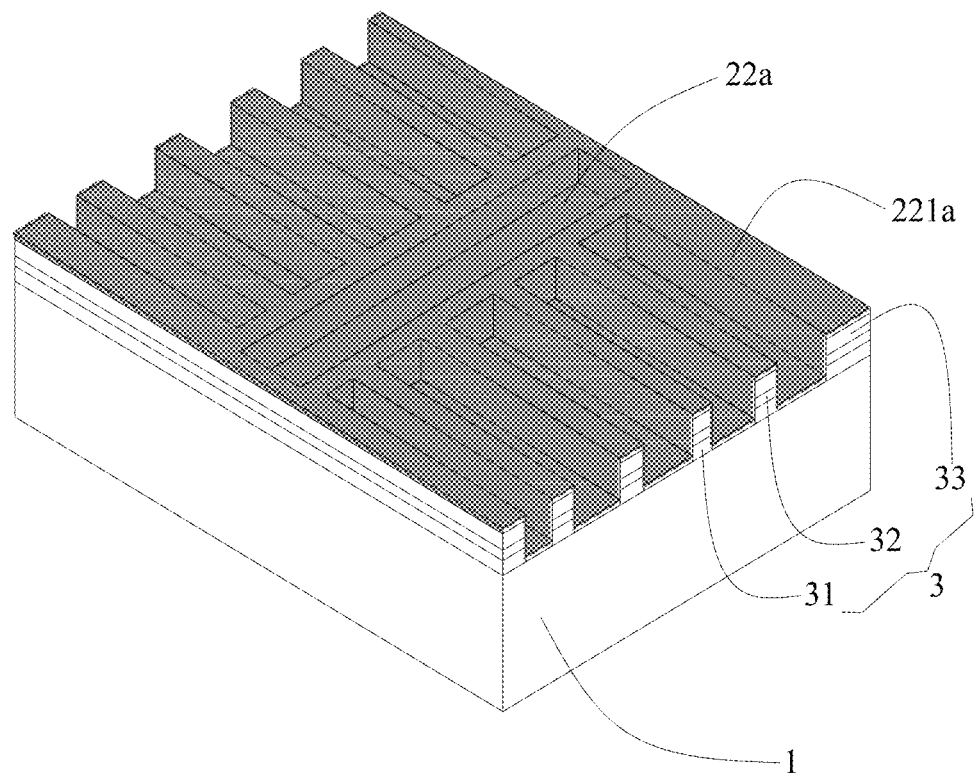

Specifically, firstly, a layer of dielectric thin film is deposited on the two-dimensional material filling slot 2a and the semiconductor light-emitting unit 3, and this layer of dielectric thin film covers the inner walls of the two-dimensional material filling slot 2a, the top surface of each of the semiconductor light-emitting units 3, and portions among a plurality of semiconductor light-emitting units 3, to form a first dielectric material layer 22a and a second dielectric material layer 221a, respectively, as shown in FIG. 14.

Materials of the first dielectric material layer 22a and second dielectric material layer 221a may be $SiO_2$ or $Si_3N_4$, and thicknesses thereof both are 10 nm to 600 nm.

The first dielectric material layer 22a and second dielectric material layer 221a may be deposited by employing Plasma Enhanced Chemical Vapor Deposition (PECVD for short), Chemical Vapor Deposition (CVD for short), Low Pressure Chemical Vapor Deposition (LPCVD for short), or Inductively Coupled Plasma Chemical Vapor Deposition (ICPCVD for short) etc.

Figure 15:
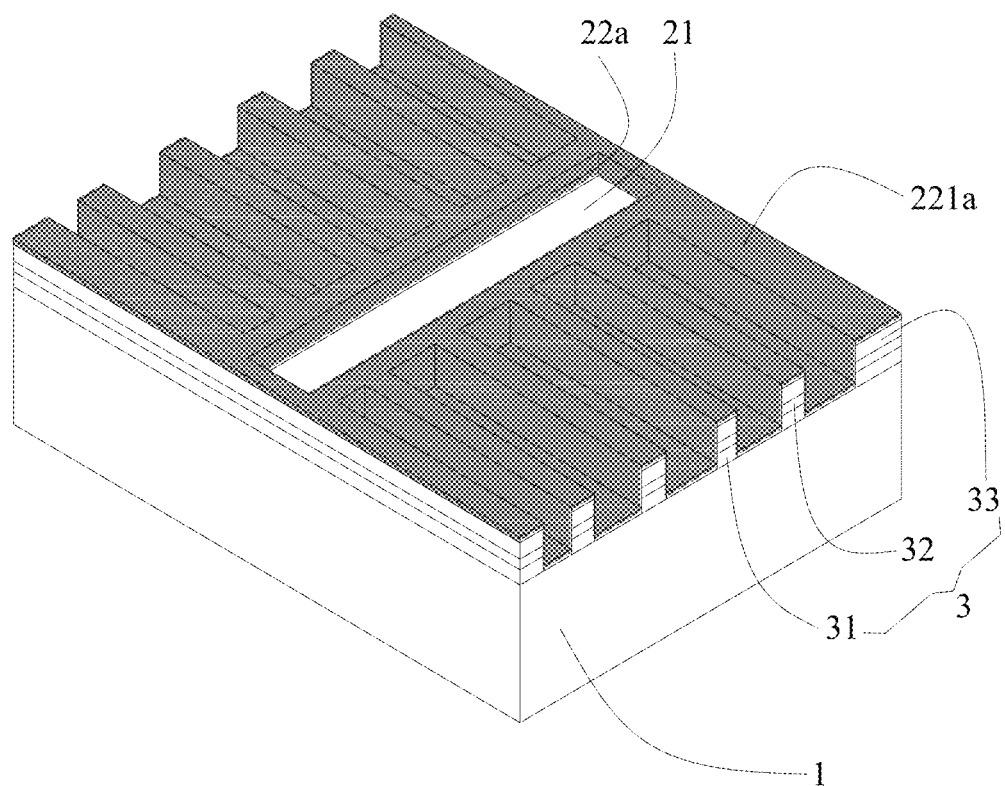

Secondly, a luminescent two-dimensional material 21 is filled into the two-dimensional material filling slot 2a, as shown in FIG. 15.

The luminescent two-dimensional material 21 is a high-temperature-resistant material such as black phosphorus, transition metal compound, graphene or boron nitride etc, of which a luminous band is longer than that of the semiconductor light-emitting unit 3. In consideration of the process employed in this embodiment, a high-temperature-resistant (generally above 300° C.) transition metal compound is selected in the present embodiment. A thickness of the luminescent two-dimensional material 21 is 1 ML to 2 wherein 1 ML represents a thickness of one atomic layer. That is to say, the luminescent two-dimensional material 21 may be one atomic layer, or may also be stacked multilayer atomic layers with a total thickness of no more than 2 μm. Thus, the photonic integrated device may have different luminous bands by changing the material or the number of layers of the luminescent two-dimensional material 21.

It is noted that the semiconductor light-emitting unit 3 emits the pumped light mainly by the active layer 33 therein, thus it is necessary to determine the thickness of the first dielectric material layer 22a according to the thickness of the luminescent two-dimensional material 21 to be filled so that a center height of the luminescent two-dimensional material 21 is identical to that of the active layer 33, so as to achieve greater pumping efficiency.

Figure 16:
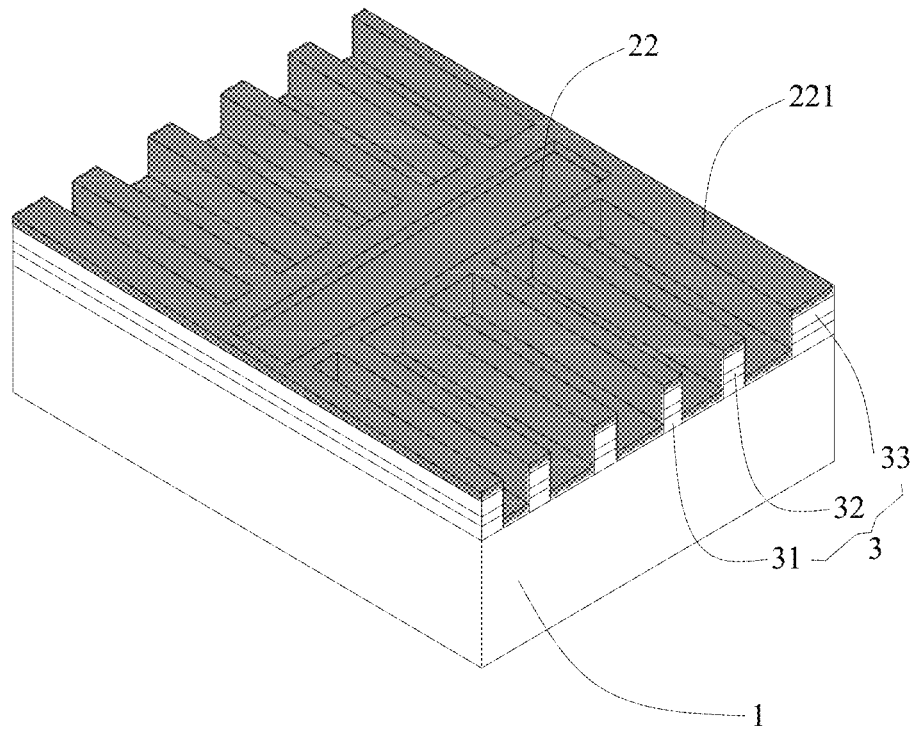

At last, another layer of dielectric thin film is deposited on the luminescent two-dimensional material 21 and the second dielectric material layer 221a, and thus a third dielectric material layer formed on the luminescent two-dimensional material 21 and the first dielectric material layer 22a form the first dielectric film 22 to entirely coat the luminescent two-dimensional material 21, and a fourth dielectric material layer formed on the second dielectric material layer 221a and the second dielectric material layer 221a form an extension part 221, as shown in FIG. 16.

Materials of the third dielectric material layer and fourth dielectric material layer may be $SiO_2$ or $Si_3N_4$, and thicknesses thereof both are 10 nm to 600 nm.

The deposition method of the third and fourth dielectric material layers is selected to be the same as that of the first dielectric material layer 22a and the second dielectric material layer 221a.

So, the luminescent two-dimensional material 21 and the first dielectric film 22 entirely coating the luminescent two-dimensional material 21 form the two-dimensional material unit 2 between the semiconductor light-emitting units 3.

Step S4, a positive electrode 41 is manufactured on the semiconductor light-emitting unit 3 and a negative electrode 42 is manufactured on the substrate 1.

Figure 17:
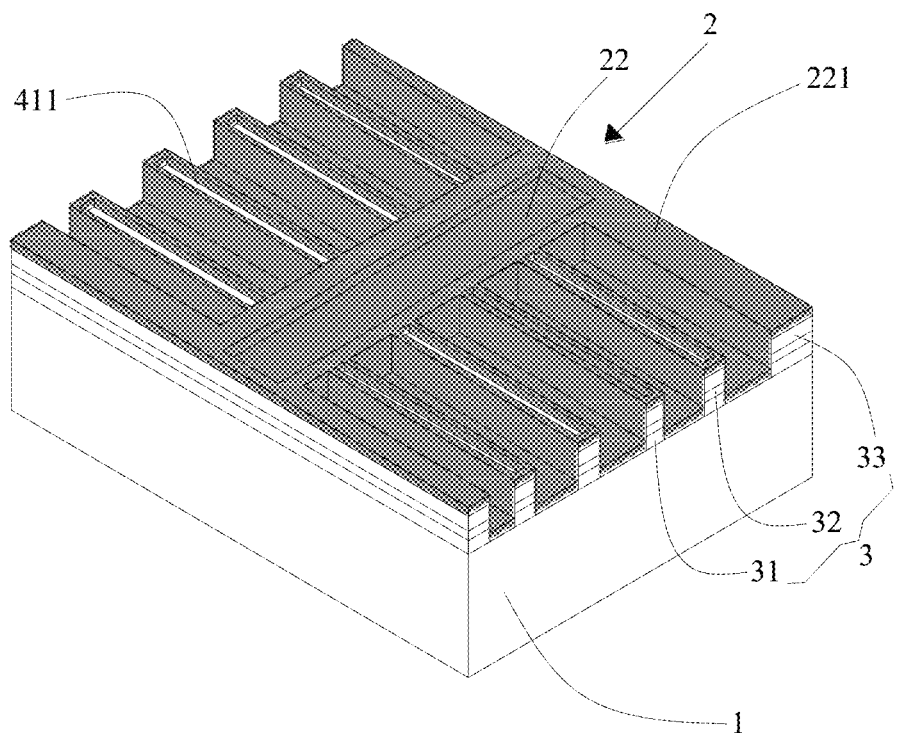

Specifically, firstly, the extension part 221 on the top of the semiconductor light-emitting unit 3 is etched, and the etching process can be performed enough deep to reach the ohmic contact layer, to form a positive electrode window 411, as shown in FIG. 17.

Then, a layer of metal is manufactured on the positive electrode window 411 to be formed as the positive electrode 41 which is filled in the positive electrode window 411 and is in contact with the ohmic contact layer.

Figure 18:
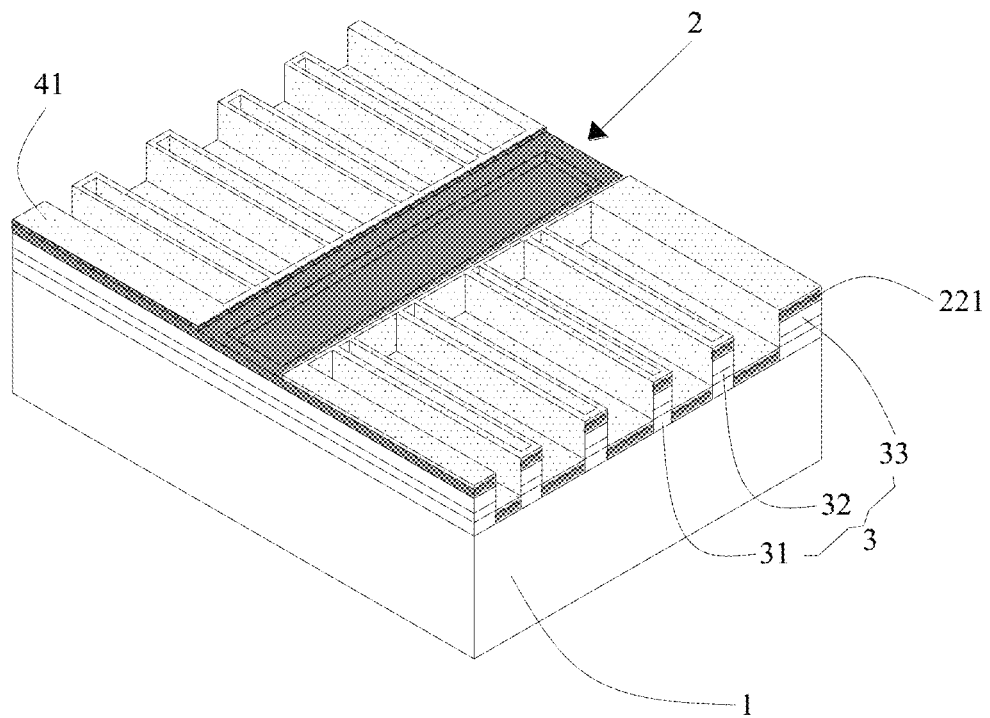

Preferably, positive electrodes 41 on the top of the plurality of semiconductor light-emitting units 3 extend and connect into a whole, to cover side walls of the semiconductor light-emitting unit 3 and the extension part 221 among a plurality of semiconductor light-emitting units 3, as shown in FIG. 18.

In the present embodiment, the positive electrode 41 may be manufactured by using a Lift-Off technique.

Figure 19:
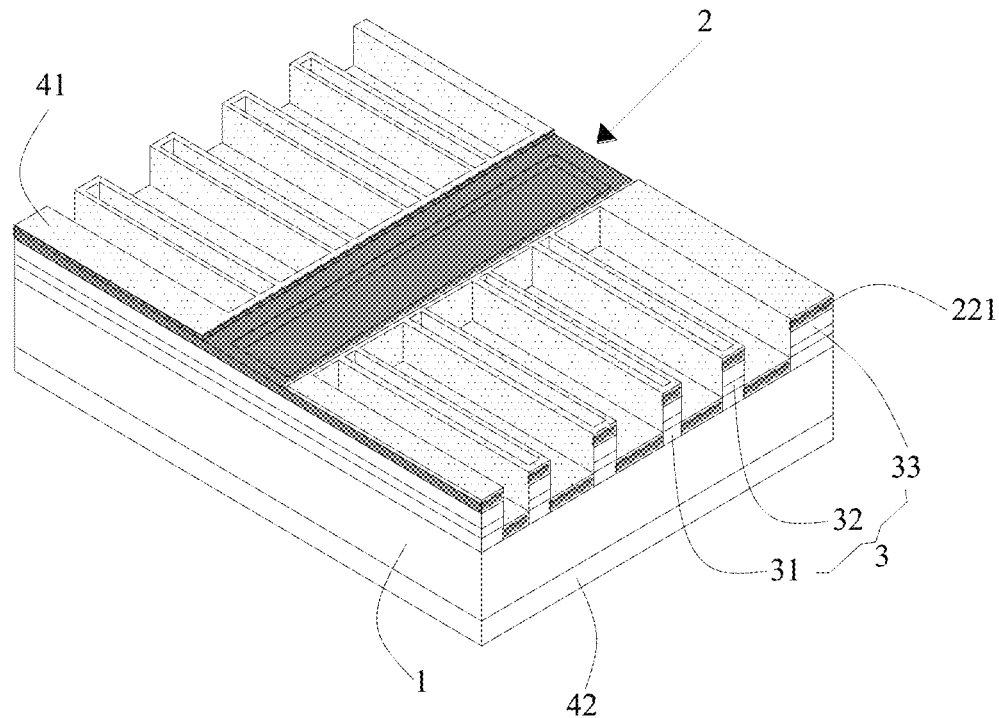

At last, a thinning process is performed on the surface of the substrate 1 facing away from the two-dimensional material unit 2, and the negative electrode 42 is manufactured, as shown in FIG. 19.

It is noted that when the manufacturing processes of the positive electrode 41 and the negative electrode 42 is are completed, an annealing process is generally necessary, at this point, the two-dimensional material unit 2 having been manufactured will be annealed together, thus it is required that the luminescent two-dimensional material 21 should be a high-temperature-resistant (the high-temperature is generally above 300° C.) two-dimensional material.

Embodiment 6

Embodiment 6 provides another manufacturing method of the photonic integrated device of embodiment 1. The manufacturing method provided in this embodiment is conducted mainly for a high-temperature-intolerance such as black phosphorus as the luminescent two-dimensional material in the photonic integrated device.

In the present embodiment, the manufacturing method of the photonic integrated device specifically includes: steps Q1-Q2 are the same as steps S1-S2 in embodiment 5 and respectively correspond to FIGS. 11-13, which are omitted here, and only differences with respect to embodiment 5 will be described. The manufacturing method of embodiment 6 differs from that of embodiment 5 in:

Step Q3, a positive electrode 41 is manufactured on the semiconductor light-emitting unit 3 and a negative electrode 42 is manufactured on the substrate 1.

Specifically, firstly, a layer of dielectric thin film is deposited on the two-dimensional material filling slot 2a and the semiconductor light-emitting unit 3, and this layer of dielectric thin film covers on the inner walls of the two-dimensional material filling slot 2a, on the top surface of each of the semiconductor light-emitting units 3, and portions among a plurality of semiconductor light-emitting units 3, to form a first dielectric material layer 22a and a second dielectric material layer 221a, respectively, as shown in FIG. 14.

It is noted that in this embodiment, only one deposition process of the dielectric thin film is needed to be performed between the process of forming the semiconductor light-emitting unit 3 and the process of forming a positive electrode 41 to be manufactured, thus the second dielectric material layer 221a formed herein will be used to form an extension part in the eventually obtained photonic integrated device.

Figure 20:
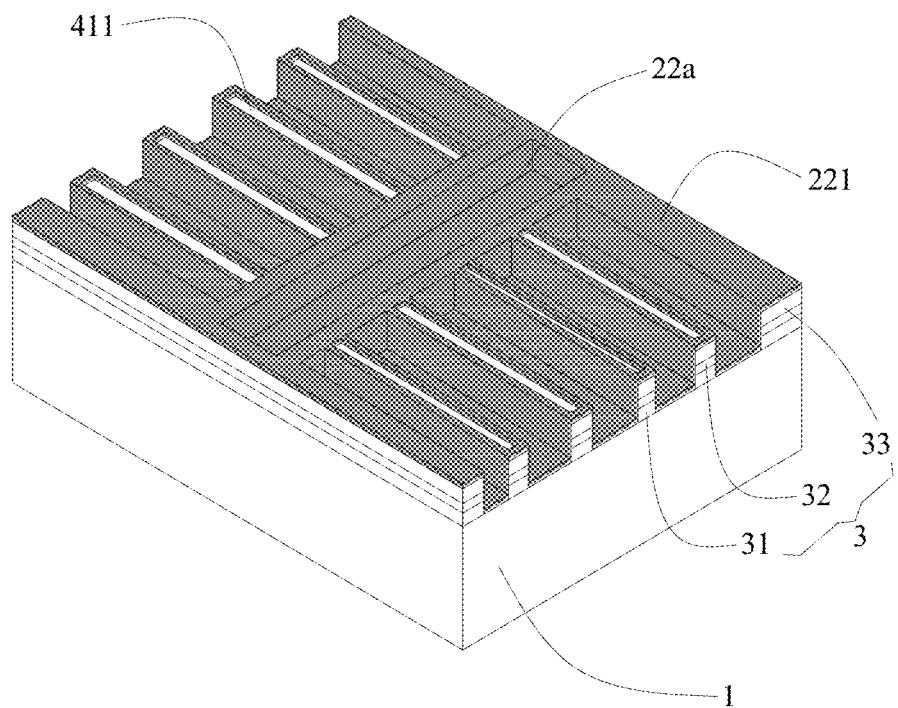
FIGS. 20-24 are process diagrams of a manufacturing method of a photonic integrated device according to embodiment 6 of the present disclosure.

Then, the extension part 221 on the top of the semiconductor light-emitting unit 3 is etched, and the etching process can be performed enough deep to reach the ohmic contact layer, to form a positive electrode window 411, as shown in FIG. 20.

Figure 21:
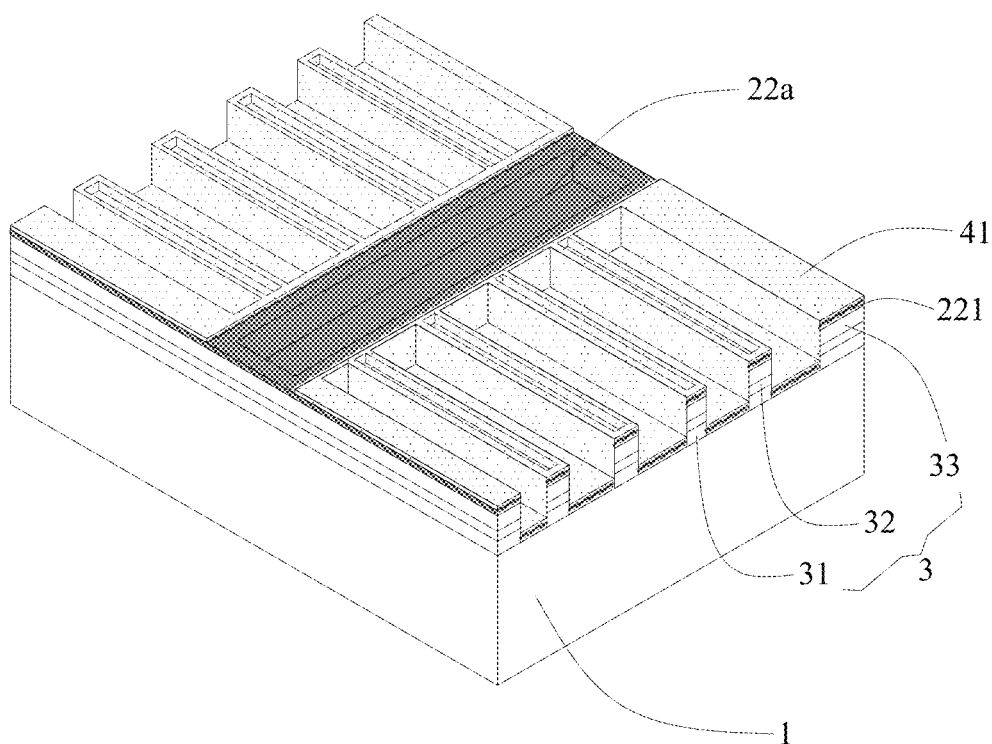

Again, a layer of metal is manufactured on the positive electrode window 411 to be formed as the positive electrode 41, and the positive electrode 41 is filled in the positive electrode window 411 and is in contact with the ohmic contact layer, as shown in FIG. 21.

Figure 22:
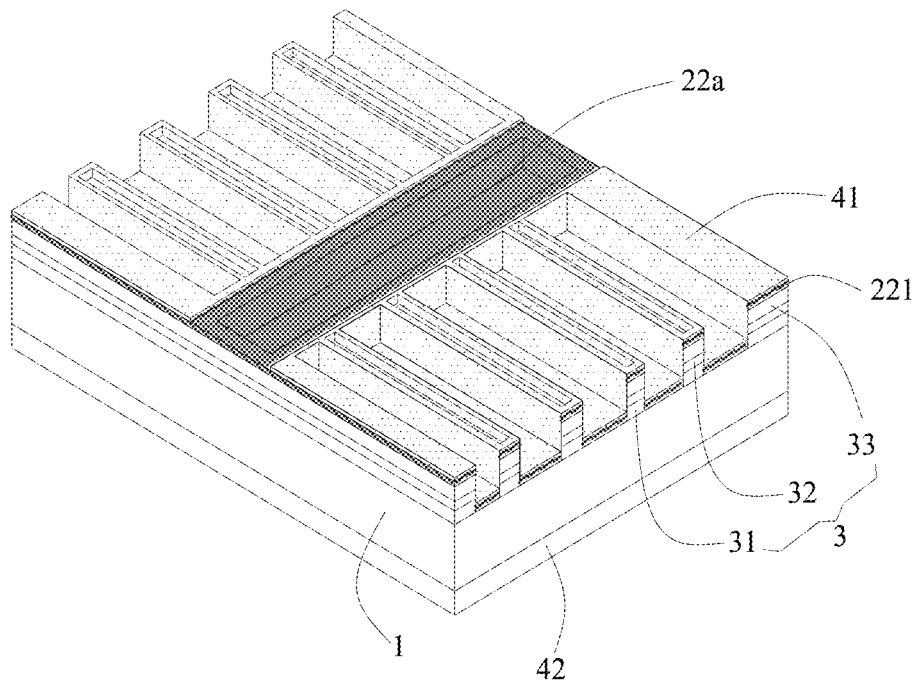

At last, a thinning process is performed on the surface of the substrate 1 facing away from the semiconductor light-emitting unit 3, and the negative electrode 42 is manufactured, as shown in FIG. 22.

Step Q4, a two-dimensional material unit 2 is formed in the two-dimensional material filling slot 2a.

Figure 23:
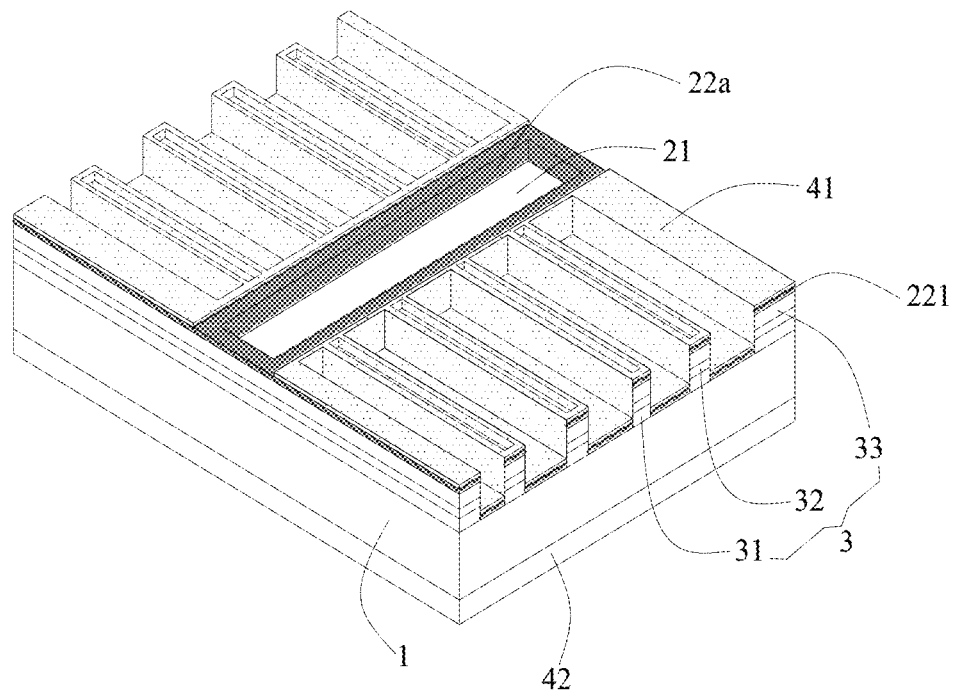

Specifically, firstly, a luminescent two-dimensional material 21 is filled into the two-dimensional material filling slot 2a, as shown in FIG. 23.

In this embodiment, the luminescent two-dimensional material 21 may be the high-temperature-intolerance black phosphorus. This is because the manufacturing processes of the positive electrode 41 and the negative electrode 42 and the annealing process have been accomplished before filling the luminescent two-dimensional material 21, thus the luminescent two-dimensional material 21 is no need to be annealed, that is, a high-temperature-intolerance luminescent two-dimensional material is seletable.

Figure 24:
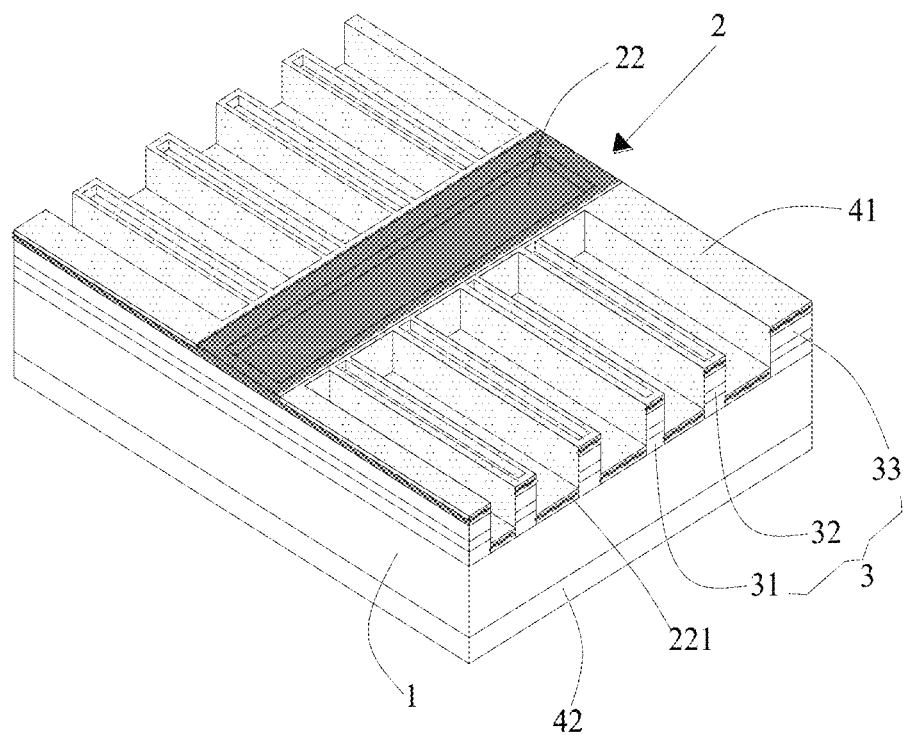

Then, another layer of dielectric thin film is deposited on the luminescent two-dimensional material 21 and the positive electrode 41, and thus a fifth dielectric material layer formed on the luminescent two-dimensional material 21 and the first dielectric material layer 22a form the first dielectric film 22 to entirely coat the luminescent two-dimensional material 21; and a portion of the dielectric thin film coated on the positive electrode 41 is removed, as shown in FIG. 24.

So, the luminescent two-dimensional material 21 and the first dielectric film 22 entirely coating the luminescent two-dimensional material 21 form the two-dimensional material unit 2 between the semiconductor light-emitting units 3.

Since the photonic integrated device manufactured according to this embodiment uses the high-temperature-intolerance black phosphorus as the luminescent two-dimensional material 21, a method of manufacturing the positive electrode 41 and the negative electrode 42 in advance is adopted, such that a dielectric film under the positive electrode 41 is obtained only by performing the process of manufacturing the dielectric thin film once, while the first dielectric film 22 coating the luminescent two-dimensional material 21 are obtained by performing the process of manufacturing the dielectric thin film twice.

Embodiment 7

Embodiment 7 provides a manufacturing method of the photonic integrated device of embodiment 4. The manufacturing method provided in this embodiment is also conducted for a high-temperature-intolerance such as black phosphorus as the luminescent two-dimensional material in the photonic integrated device.

In the present embodiment, the manufacturing method of the photonic integrated device specifically includes: steps W1-W2 are the same as steps S1-S2 in embodiment 5 and respectively correspond to FIGS. 11-13, which are omitted here, and only differences with respect to embodiment 5 will be described. The manufacturing method of embodiment 7 differs from that of embodiment 5 in:

Step W3, a positive electrode 41 is manufactured on the semiconductor light-emitting unit 3, and a negative electrode 42 is manufactured on the substrate 1.

Figure 25:
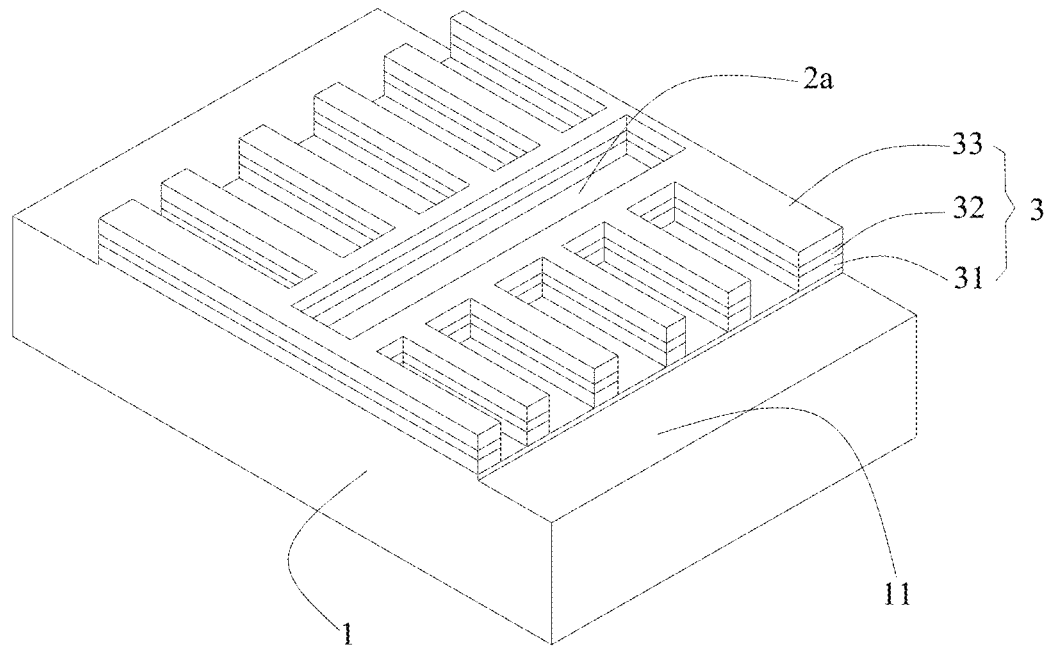
FIGS. 25-31 are process diagrams of a manufacturing method of a photonic integrated device according to embodiment 7 of the present disclosure.

Specifically, above all, firstly, an end of the semiconductor light-emitting unit 3 away from the two-dimensional material filling slot 2a is etched, and thus the substrate 1 below the etched portion is exposed, and a negative electrode region 11 is formed at an outer end of the substrate 1, as shown in FIG. 25.

Figure 26:
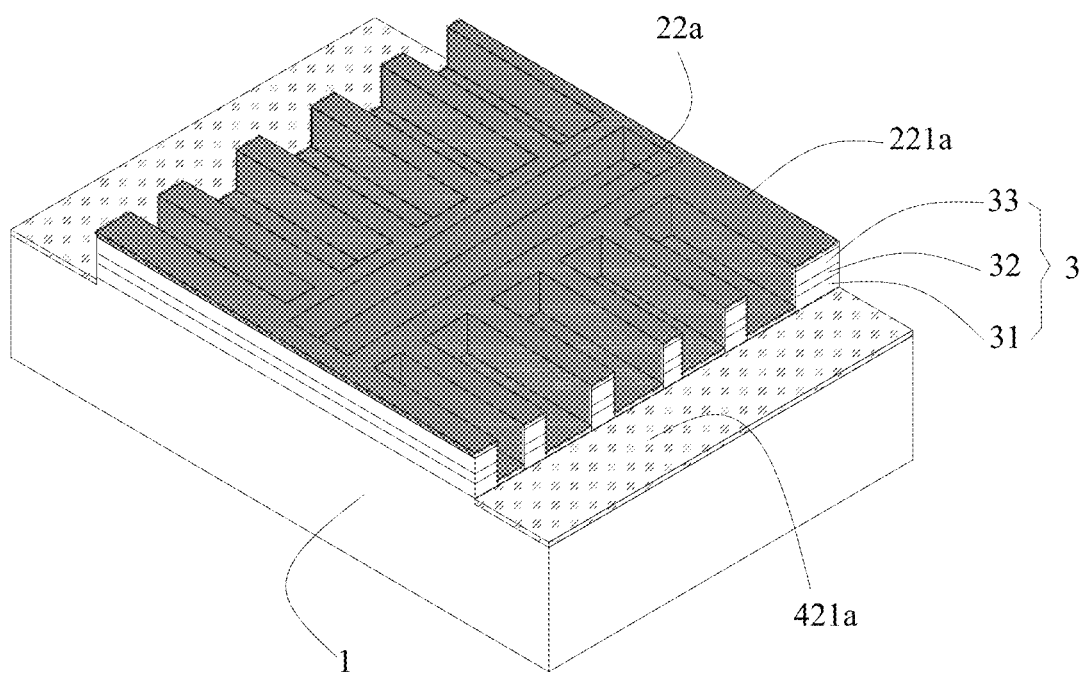

Second, a layer of dielectric thin film is deposited on the two-dimensional material filling slot 2a, the semiconductor light-emitting unit 3 and the negative electrode region 11, and this layer of dielectric thin film covers on the inner walls of the two-dimensional material filling slot 2a, the top surface of each of the semiconductor light-emitting units 3, portions among a plurality of semiconductor light-emitting units 3, and the negative electrode region 11, to form a first dielectric material layer 22a, a second dielectric material layer 221a and a sixth dielectric material layer 421a, respectively, as shown in FIG. 26.

Materials of the first dielectric material layer 22a, the second dielectric material layer 221a and the sixth dielectric material layer 421a may be $SiO_2$ or $Si_3N_4$, and thicknesses thereof are all 10 nm to 600 nm.

It is noted that in this embodiment, only one deposition process of the dielectric thin film is needed to be performed between the process of forming the semiconductor light-emitting unit 3 and the process of forming a positive electrode 41 to be manufactured, thus the second dielectric material layer 221a formed herein will be used to form an extension part in the eventually obtained photonic integrated device.

Figure 27:
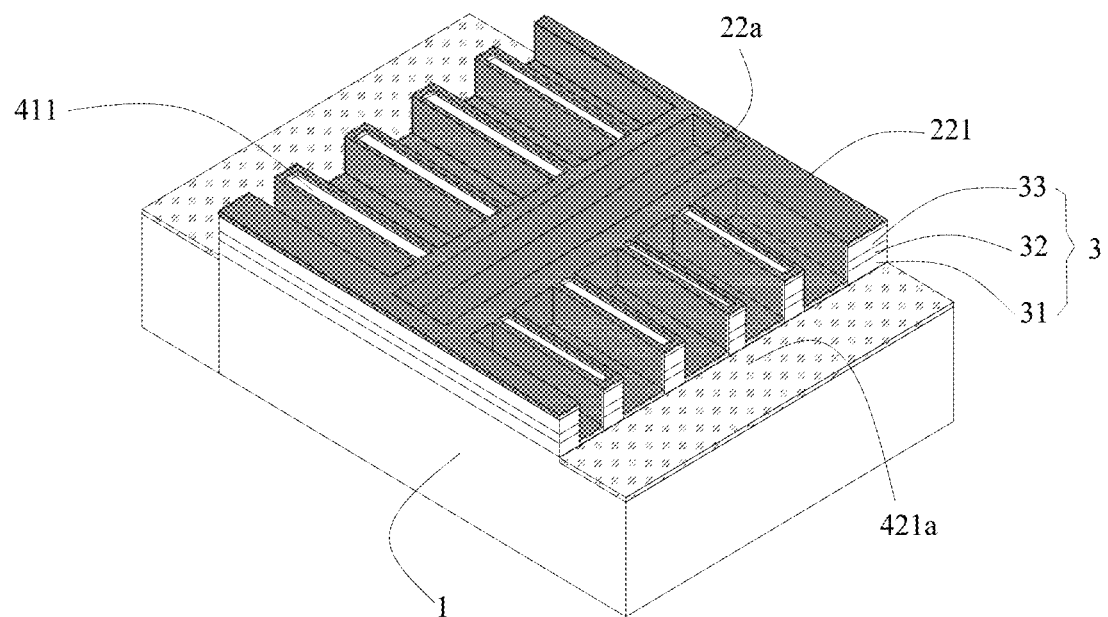

Third, the extension part 221 on the top of the semiconductor light-emitting unit 3 is etched, and the etching process can be performed enough deep to reach the ohmic contact layer, to form a positive electrode window 411, as shown in FIG. 27.

Figure 28:
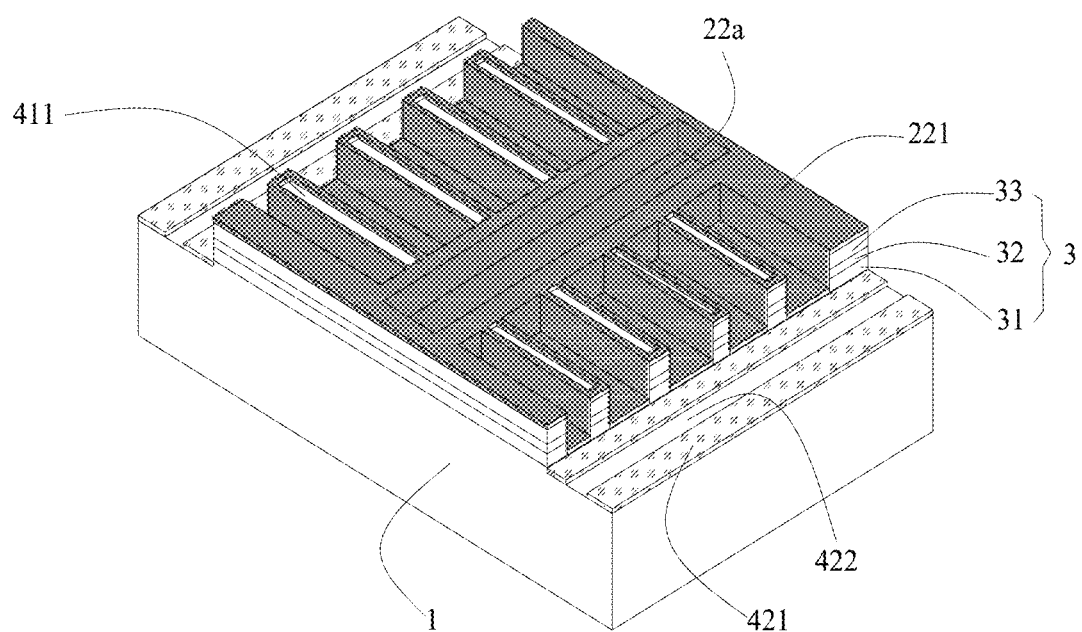

Fourth, the sixth dielectric material layer 421 is etched, preferably, the etching process can be performed deep until a part of the substrate 1 is etched, to form the second dielectric film 421 and the negative electrode window 422 located therein, as shown in FIG. 28.

Figure 29:
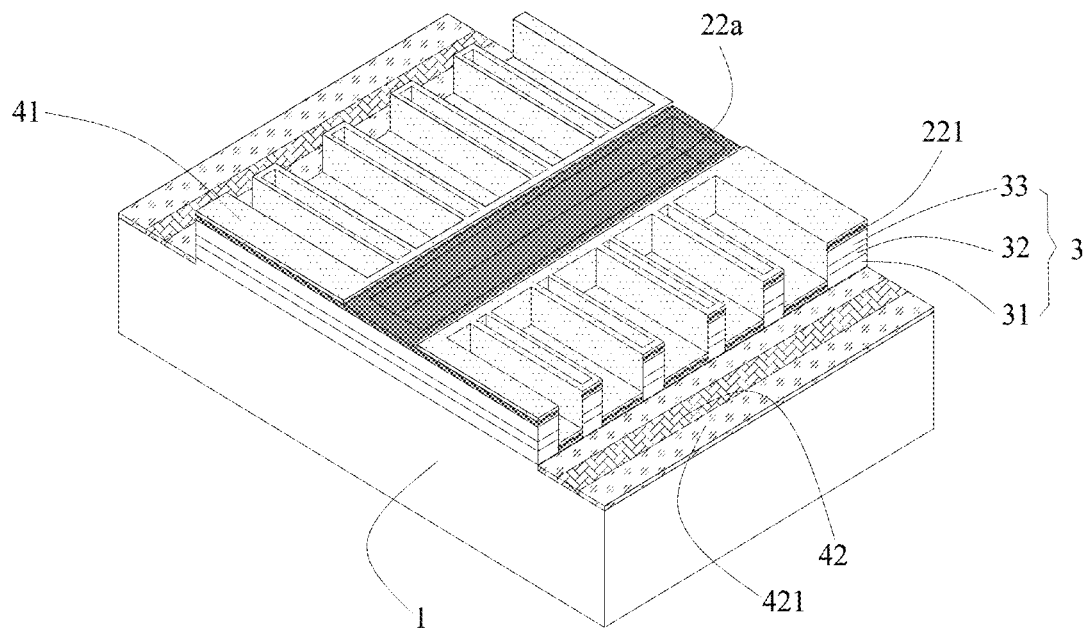

At last, a layer of metal is manufactured on the positive electrode window 411 to be formed as the positive electrode 41, and the positive electrode 41 is filled in the positive electrode window 411 and is in contact with the ohmic contact layer; and a layer of metal is manufactured on a negative electrode window 422 to be formed as the negative electrode 42, and the negative electrode 42 is filled in the negative electrode window 422 and is in contact with the substrate 1, as shown in FIG. 29.

In the present embodiment, the positive electrode 41 and the negative electrode 42 both can be manufactured by using a Lift-Off technique.

Figure 30:
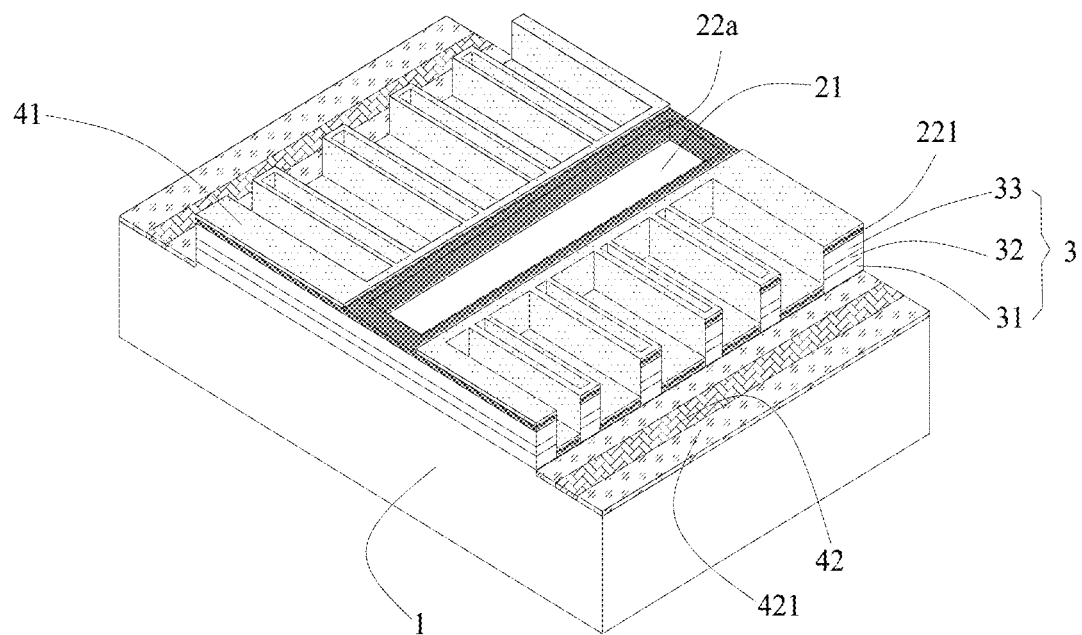

Step W4, a two-dimensional material unit 2 is formed in the two-dimensional material filling slot 2a;

Specifically, firstly, a luminescent two-dimensional material 21 is filled into the two-dimensional material filling slot 2a, as shown in FIG. 30.

In this embodiment, the luminescent two-dimensional material 21 may be the high-temperature-intolerance black phosphorus. This is because the manufacturing processes of the positive electrode 41 and the negative electrode 42 and the annealing process have been accomplished before filling the luminescent two-dimensional material 21, thus the luminescent two-dimensional material 21 is no need to be annealed, that is, a high-temperature-intolerance luminescent two-dimensional material is seletable.

Figure 31:
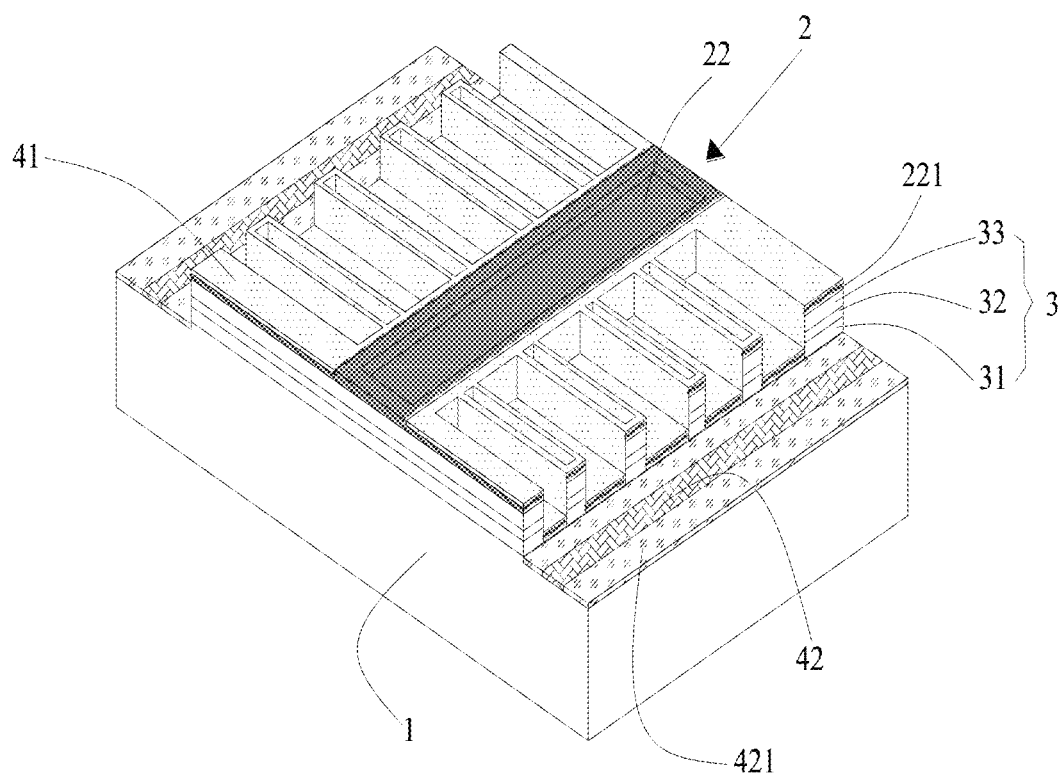

Then, another layer of dielectric thin film is deposited on the luminescent two-dimensional material 21, the positive electrode 41, the negative electrode 42 and the second dielectric film 421, a fifth dielectric material layer formed on the luminescent two-dimensional material 21 and the first dielectric material layer 22a form the first dielectric film 22 to entirely coat the luminescent two-dimensional material 21; and a portion of the dielectric thin film coated on the positive electrode 41, the negative electrode 42 and the second dielectric film 421 is removed, as shown in FIG. 31.

So, the luminescent two-dimensional material 21 and the first dielectric film 22 entirely coating the luminescent two-dimensional material 21 form the two-dimensional material unit 2 located between the opposing semiconductor light-emitting units 3.

A top surface of the substrate 1 outside an end of the semiconductor light-emitting unit 3 away from the two-dimensional material unit 2 is exposed, a second dielectric film 421 is disposed on the exposed area, a negative electrode 42 is disposed on the second dielectric film 421, and the negative electrode 42 penetrates the second dielectric film 421 to come into contact with the substrate 1 in the exposed area; that is to say, the negative electrode 42 is disposed on a surface of the substrate 1 on which the two-dimensional material unit 2 and the semiconductor light-emitting unit 3 are disposed, and is located at outside of the semiconductor light-emitting unit 3 away from the two-dimensional material unit 2.

Although the present invention is shown and described with reference to the special exemplary embodiment, while those skilled in the art will understand: various changes in form and details may be made therein without departing from the spirit and scope of the disclosure as defined by the appended claims and its equivalents.

What is claimed is:
1. A photonic integrated device, comprising:
   a substrate, wherein:

a two-dimensional material unit and semiconductor light-emitting units located at both sides thereof are disposed on the substrate;
the two-dimensional material unit is comprised of a luminescent two-dimensional material of which a luminous band is longer than that of the semiconductor light-emitting units and of a dielectric film entirely coating the luminescent two-dimensional material, and
the semiconductor light-emitting units provide a pump light source for the two-dimensional material unit to pump the luminescent two-dimensional material to emit light.

2. The photonic integrated device of claim 1, wherein a plurality of the semiconductor light-emitting units are arranged spaced apart at each of the both sides of the two-dimensional material unit.

3. The photonic integrated device of claim 2, wherein light outlets of the plurality of semiconductor light-emitting units at the both sides of the two-dimensional material unit are opposite in a staggered manner.

4. The photonic integrated device of claim 3, wherein the semiconductor light-emitting unit is a semiconductor laser or a superluminescent diode.

5. The photonic integrated device of claim 2, wherein two to fifty the semiconductor light-emitting units are disposed at each of the both sides of the two-dimensional material unit; a distance between each two adjacent semiconductor light-emitting units is 20 μm to 500 μm; and the semiconductor light-emitting unit has a length of 0.5 mm to 5 mm and a width of 5 μm to 200 μm.

6. The photonic integrated device of claim 1, wherein the luminescent two-dimensional material is selected from at least one of black phosphorus, transition metal compound, graphene, and boron nitride.

7. The photonic integrated device of claim 6, wherein the luminescent two-dimensional material has a thickness of 1 ML to 2 μm.

8. The photonic integrated device of claim 1, wherein the semiconductor light-emitting unit comprises sequentially laminated a buffer layer, a lower coating layer, a lower waveguide layer, an active layer, an upper waveguide layer, an upper coating layer and an ohmic contact layer.

9. The photonic integrated device of claim 8, wherein:
the buffer layer, the lower coating layer and a portion of the lower waveguide layer adjacent to the lower coating layer in a plurality of the semiconductor light-emitting units extend and connect into a whole; and
the active layer and a portion of the upper waveguide layer adjacent to the active layer in the plurality of the semiconductor light-emitting units extend and connect into a whole.

10. The photonic integrated device of claim 8, wherein the dielectric film extends towards a top surface of the semiconductor light-emitting unit to form an extension part on which a positive electrode is disposed, and the positive electrode penetrates the extension part and is in contact with the ohmic contact layer; and a negative electrode is disposed on the substrate.

11. A manufacturing method of the photonic integrated device of claim 1, comprising:
selecting a substrate and manufacturing an etching base layer on the substrate, the etching base layer comprising a buffer material layer, a lower coating material layer, a lower waveguide material layer, an active region material layer, an upper waveguide material layer, an upper coating material layer and an ohmic contact material layer sequentially laminated on the substrate;
etching the etching base layer in a direction perpendicular to the substrate, and forming a two-dimensional material filling slot and semiconductor light-emitting units located at both sides of the two-dimensional material filling slot on the substrate, wherein a plurality of the semiconductor light-emitting units are formed at both sides of the two-dimensional material filling slot, respectively;
forming a two-dimensional material unit which comprising a luminescent two-dimensional material and a dielectric film entirely coating the luminescent two-dimensional material in the two-dimensional material filling slot; and
manufacturing a positive electrode on the ohmic contact layer and a negative electrode on the substrate.

12. The manufacturing method of claim 11, wherein a distance between a bottom surface of the two-dimensional material filling slot and the substrate is 20 nm to 500 nm less than the distance between a bottom of the active region material layer and the substrate; and the two-dimensional material filling slot has a length of 0.1 mm to 10 mm and a width of 10 μm to 500 μm.

13. The manufacturing method of claim 11, wherein:
a plurality of the semiconductor light-emitting units are arranged spaced apart at each of the both sides of the two-dimensional material unit; and
light outlets of the plurality of semiconductor light-emitting units at the both sides of the two-dimensional material unit are opposite in a staggered manner.

14. The manufacturing method of claim 11, wherein:
the two-dimensional material unit comprises the luminescent two-dimensional material and a dielectric film entirely coating the luminescent two-dimensional material; and
the semiconductor light-emitting unit comprises sequentially laminated a buffer layer, a lower coating layer, a lower waveguide layer, an active layer, an upper waveguide layer, an upper coating layer and an ohmic contact layer.

15. The manufacturing method of claim 14, wherein:
the buffer layer, the lower coating layer and a portion of the lower waveguide layer adjacent to the lower coating layer in a plurality of the semiconductor light-emitting units extend and connect into a whole; and
the active layer and a portion of the upper waveguide layer adjacent to the active layer in the a plurality of the semiconductor light-emitting units extend and connect into a whole.

16. The manufacturing method of claim 14, wherein:
the dielectric film extends towards a top surface of the semiconductor light-emitting unit to form an extension part on which a positive electrode is disposed;
the positive electrode penetrates the extension part and is in contact with the ohmic contact layer; and
a negative electrode is disposed on the substrate.

17. The manufacturing method of claim 12, wherein:
the two-dimensional material unit comprises the luminescent two-dimensional material and a dielectric film entirely coating the luminescent two-dimensional material;
the semiconductor light-emitting unit comprises sequentially laminated a buffer layer, a lower coating layer, a lower waveguide layer, an active layer, an upper waveguide layer, an upper coating layer and an ohmic contact layer; and the buffer layer, the lower coating layer and a portion of the lower waveguide layer adjacent to the lower coating layer in a plurality of the semiconductor light-emitting units extend and connect into a whole, the active layer and a portion of the upper waveguide layer adjacent to the active layer in the a plurality of the semiconductor light-emitting units extend and connect into a whole.

18. The manufacturing method of claim 13, wherein:

the two-dimensional material unit comprises the luminescent two-dimensional material and a dielectric film entirely coating the luminescent two-dimensional material;

the semiconductor light-emitting unit comprises sequentially laminated a buffer layer, a lower coating layer, a lower waveguide layer, an active layer, an upper waveguide layer, an upper coating layer and an ohmic contact layer;

the dielectric film extends towards a top surface of the semiconductor light-emitting unit to form an extension part on which a positive electrode is disposed; and the positive electrode penetrates the extension part and is in contact with the ohmic contact layer; and a negative electrode is disposed on the substrate.

19. The photonic integrated device of claim 3, wherein:

the two-dimensional material unit comprises the luminescent two-dimensional material and a dielectric film entirely coating the luminescent two-dimensional material; and the semiconductor light-emitting unit comprises sequentially laminated a buffer layer, a lower coating layer, a lower waveguide layer, an active layer, an upper waveguide layer, an upper coating layer and an ohmic contact layer.

20. The photonic integrated device of claim 4, wherein:

the two-dimensional material unit comprises the luminescent two-dimensional material and a dielectric film entirely coating the luminescent two-dimensional material; and the semiconductor light-emitting unit comprises sequentially laminated a buffer layer, a lower coating layer, a lower waveguide layer, an active layer, an upper waveguide layer, an upper coating layer and an ohmic contact layer.

\* \* \* \* \*